(12) United States Patent
Takano et al.

(10) Patent No.: US 11,367,627 B2
(45) Date of Patent: Jun. 21, 2022

(54) METHODS FOR MANUFACTURING SEMICONDUCTOR DEVICE AND WIRING STRUCTURE

(71) Applicant: NAGASE & CO., LTD., Osaka (JP)

(72) Inventors: Tadashi Takano, Columbus, OH (US); Michihiro Sato, Tokyo (JP)

(73) Assignee: NAGASE & CO., LTD., Osaka (JP)

( * ) Notice: Subject to any disclaimer, the term of this patent is extended or adjusted under 35 U.S.C. 154(b) by 0 days.

(21) Appl. No.: 17/041,637

(22) PCT Filed: Mar. 26, 2019

(86) PCT No.: PCT/JP2019/012668
§ 371 (c)(1),
(2) Date: Sep. 25, 2020

(87) PCT Pub. No.: WO2019/189063
PCT Pub. Date: Oct. 3, 2019

(65) Prior Publication Data
US 2021/0035817 A1 Feb. 4, 2021

(30) Foreign Application Priority Data
Mar. 29, 2018 (JP) .............................. JP2018-064423

(51) Int. Cl.
*H01L 21/48* (2006.01)
*H01L 21/56* (2006.01)
(Continued)

(52) U.S. Cl.
CPC ........ *H01L 21/486* (2013.01); *H01L 21/4857* (2013.01); *H01L 21/56* (2013.01); *H01L 23/3128* (2013.01); *H01L 23/49822* (2013.01)

(58) Field of Classification Search
None
See application file for complete search history.

(56) References Cited

U.S. PATENT DOCUMENTS

2003/0021759 A1 1/2003 Milbradt et al.
2007/0246250 A1* 10/2007 Tomita ................. H05K 3/4602
174/258

(Continued)

FOREIGN PATENT DOCUMENTS

JP 10-256698 9/1998
JP 2001-111195 4/2001

(Continued)

OTHER PUBLICATIONS

International Search Report (ISR) issued in International Patent Application No. PCT/JP2019/012668, dated May 21, 2019, together with English translation thereof.

(Continued)

*Primary Examiner* — Jay C Chang
(74) *Attorney, Agent, or Firm* — Greenblum & Bernstein, P.L.C.

(57) ABSTRACT

The present invention relates to a method for manufacturing a semiconductor device in which a circuit element including a semiconductor chip, and a through conductor connecting an insulation layer in a thickness direction are embedded in the insulation layer. A wiring structure in which a predetermined pattern of wiring conductors is formed along a planar direction on an insulation part is created, and thereafter the wiring structure is sealed in the insulation layer in a state where the wiring structure is erected vertically. Consequently, the wiring conductor of the wiring conductor is caused to function as the through conductor in the insulation layer.

12 Claims, 14 Drawing Sheets

(51) Int. Cl.
*H01L 23/31* (2006.01)
*H01L 23/498* (2006.01)

(56) References Cited

U.S. PATENT DOCUMENTS

2008/0047137 A1* 2/2008 Asahi .................. H05K 3/366
 29/876
2012/0103679 A1 5/2012 Yamamoto et al.

FOREIGN PATENT DOCUMENTS

| | | |
|---|---|---|
| JP | 2003-12438 | 1/2003 |
| JP | 2004-87835 | 3/2004 |
| JP | 2005-285945 | 10/2005 |
| JP | 2008-16729 | 1/2008 |
| JP | 2012-164998 | 8/2012 |

OTHER PUBLICATIONS

International Preliminary Report on Patentability (IPRP) issued in International Patent Application No. PCT/JP2019/012668, dated Oct. 8, 2020, together with English translation thereof.

* cited by examiner

Fig.5
[S13]
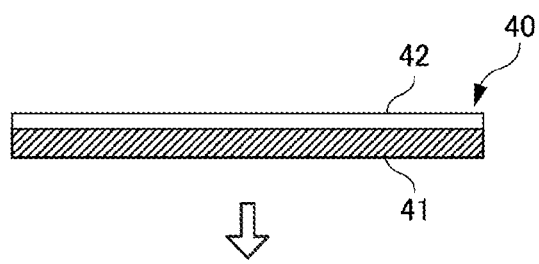
[S14]
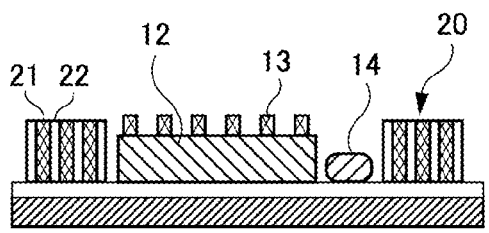
[S15]
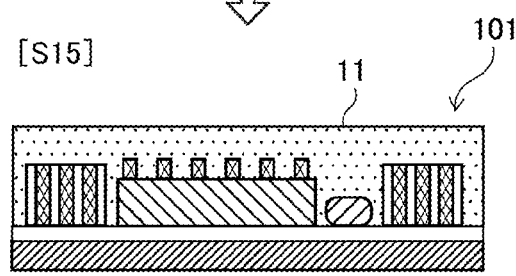
[S16]
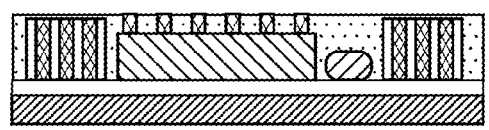
[S17]
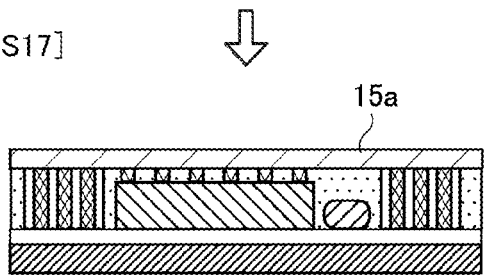
[S18]
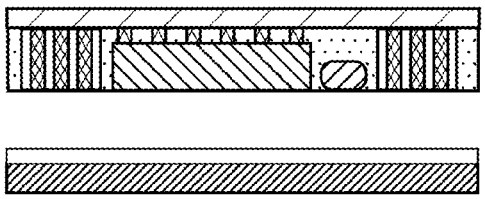
[S19]
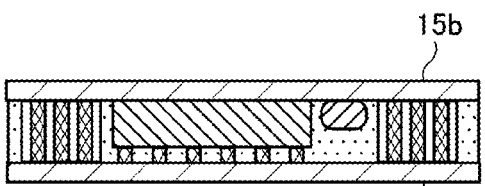
[S20]
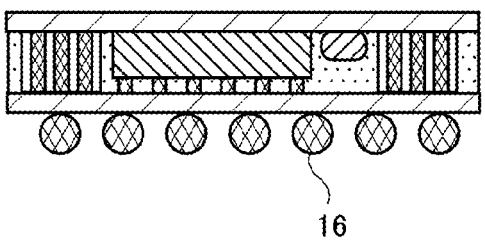

METHODS FOR MANUFACTURING SEMICONDUCTOR DEVICE AND WIRING STRUCTURE

TECHNICAL FIELD

The present invention relates to a method for manufacturing a semiconductor device. The present invention also relates to a method for manufacturing a wiring structure to be used in the manufacture of a semiconductor device.

BACKGROUND ART

With regard to a method for manufacturing a semiconductor device, a technique is known in which a plurality of semiconductor chips are laminated three-dimensionally, and then the semiconductor chips are connected to each other by wiring. In order to laminate the semiconductor chips three-dimensionally, it is necessary to seal, with a resin, a plurality of semiconductor chips arranged in the same plane to create a pseudo wafers, and then to form a through conductor (through via) to penetrate through the resin layer and to connect upper and lower pseudo wafers to each other via the through conductor.

As a method for forming a through conductor in a resin layer, a technique is conventionally known in which a through hole is formed in the resin layer by drilling or laser machining and then a conductor is embedded in the through hole (Patent Document 1). However, in such a method for forming a through hole in a resin layer, there are limits to how much the through conductors can be refined and to how narrow the pitch between through conductors can be made, and thus there is a problem in that it is difficult to respond to the current needs for device size reduction. Further, when forming a through hole in a resin layer with a drill or laser, the hole opening diameter narrows in a tapered manner at deeper positions of the through hole. This leads to a problem in that conduction between the upper and lower pseudo wafers cannot be achieved or the reliability of such conduction decreases if the hole opening diameter of the through hole is reduced. In this way, there was room for improvement in the prior art in terms of the complexity of the machining process, the manufacturing costs, the yield, and the like.

Further, in another known method for forming a through conductor in a resin layer, an internal connection electrode which functions as a through conductor is sealed in a resin layer together with a semiconductor chip (Patent Document 2). Specifically, in the method disclosed in Patent Document 2, a plurality of internal connection electrodes which are integrated by means of a connection plate are connected in advance together with a semiconductor chip to a wiring pattern of an organic substrate. Subsequently, the internal connection electrodes and the semiconductor chip are sealed with a resin on the organic substrate, and then the internal connection electrodes are divided into individual electrodes by grinding the connection plate so that each internal connection electrode can be used as a through conductor within the resin layer. Due to this configuration, it is not necessary to form a through hole by drilling or laser machining, and thus the above-described problems of the prior art can be overcome, and it is possible to manufacture a semiconductor device in which semiconductor chips are laminated three-dimensionally at low cost and in a short amount of time.

PRIOR ART DOCUMENTS

Patent Documents

Patent Document 1: JP2003-12438A
Patent Document 2: JP2008-016729A

SUMMARY OF INVENTION

Technical Problem

However, in the method disclosed in Patent Document 2, it is necessary to create in advance a structure in which column-shaped or rod-shaped internal connection electrodes are integrated by means of a connection plate. Patent Document 2 does not explain in detail the method for creating such a structure, but it is believed that creating such a structure would require constructing the column-shaped or rod-shaped internal connection electrodes in the thickness direction on the connection plate. However, such a process for constructing electrodes in the thickness direction requires a high-precision machining technology, and thus poses a problem due to an increase in machining costs. Further, equipment for machining internal connection electrodes in this way does not exist in a general facility for manufacturing a semiconductor device. Thus, it would be necessary to develop and introduce new equipment for producing the internal connection electrodes, and this would generate costs related to introduction and maintenance of such new equipment. Moreover, since the internal connection electrodes are erected vertically on the connection plate, there is also a limit to how high they can be erected. In addition, in the technology of Patent Document 2, the internal connection electrodes are only conceived as being molded in a linear fashion, and thus there is a problem in that the design flexibility of the through conductor to be formed in the resin layer of the semiconductor device is low.

Given the above, an object of the present invention is to provide a method for manufacturing a semiconductor device including a step in which a wiring structure that functions as a through conductor is sealed in an insulation layer (mold resin layer) together with a circuit element such as a semiconductor chip, which makes it possible to create the wiring structure at lower cost and to improve the design flexibility of the through conductor.

Solution to Problem

As a result of diligent examination of solutions to the above-described problems of the prior art, the inventors of the present invention discovered that wiring conductors formed in a planar fashion can be made to function as through conductors (through vias) in an insulation layer by creating in advance a wiring structure in which a predetermined pattern of wiring conductors is formed in a planar fashion, and then sealing the wiring structure in the insulation layer together with a circuit element in a state where the wiring structure is erected vertically. On the basis of this discovery, the present inventors arrived at a solution to the above-described problems of the prior art, thereby completing the present invention.

A first aspect of the present invention relates to a method for manufacturing a semiconductor device. The semiconductor device has a structure in which a circuit element and a through conductor connecting, in a thickness direction, a top surface and a bottom surface of an insulation layer are embedded in the insulation layer. Examples of the "circuit element" include a semiconductor chip (active element) such as an LSI, and an electronic element (passive element) such as a resistance element. For example, a semiconductor chip may be embedded in the insulation layer, and additionally a connection terminal for connecting the semiconductor chip to a rewiring layer or the like, and other electronic elements, etc. may be further embedded in the insulation layer. Alternatively, only the electronic elements may be embedded in the insulation layer, and then a semiconductor chip may be disposed on the rewiring layer. In the present invention, first, a wiring structure in which a predetermined pattern of wiring conductors is formed along a planar direction on an insulation part is formed. Subsequently, the wiring structure is sealed in the insulation layer in a state where the wiring structure is erected vertically. Due to this configuration, the wiring conductors in the insulation layer function as through conductors. In the specification of the present application, "conductor" (through conductor, wiring conductor) is a general term for electric conductors formed from a material having electric conductivity and thermal conductors formed from a material having thermal conductivity. In other words, a through conductor and a wiring conductor should have at least one of electric conductivity and thermal conductivity. Further, "a state where the wiring structure is erected vertically" indicates a state in which the wiring conductors in the wiring structure extend in the thickness direction of the insulation layer.

As described above, in the present invention, when creating the wiring structure, the wiring conductors are formed in a planar fashion. At this time, the wiring conductors may be laminated in a plurality of layers in the vertical direction. By forming the wiring conductors in a planar fashion in this way, the wiring structure can be created easily and at low cost compared to the prior art in which it was necessary to vertically construct the internal connection electrodes. Further, since the wiring conductors can be formed in a plane, the wiring conductors can be freely designed in not only a simple linear shape but also a shape having a bending point, a curving point, or a branching point. The sealing of the wiring conductors together with the circuit element in the insulation layer is performed in a state in which the wiring structure is erected vertically. Therefore, the wiring conductors formed in a planar fashion can be made to function as through conductors that penetrate through the insulation layer in the thickness direction (vertical direction). The machining process for forming the wiring conductors in a planar fashion in the present invention can be carried out with high precision compared to the conventional machining process in which a through hole is opened in the insulation layer using a laser or a drill, and thus the through conductors in the insulation layer can be refined and the pitch between through conductors can be further narrowed. In addition, the process for producing the through conductors (wiring structure) is separate from the process for packaging the semiconductor device, and thereby the manufacturing process of the semiconductor device (wafer level package) can be significantly simplified.

Further, in the present invention, in the wiring structure, the wiring conductors are formed in a predetermined pattern on the insulation part. Therefore, even if, for example, the wiring conductors are arranged at a narrow pitch, the insulation part between the wiring conductors functions as a spacer, and thus the insulation state between the wiring conductors can be maintained. Specifically, when sealing the wiring structure together with the circuit element in the insulation layer, the positions of the wiring conductors may deviate due to the flow of a mold resin that constitutes the insulation layer, or the wiring conductors may contact each other resulting in unintended conduction. With regard to this point, by using a structure in which the wiring structure includes the wiring conductors and the insulation part as in the present invention, the intervals between the wiring conductors can also be reliably maintained even when sealing the wiring structure in the insulation layer. In addition, in the present invention, since the wiring conductors can be formed in a plane on the insulation part, multiple rows of wiring conductors can be easily formed. In particular, the number of rows of wiring conductors can be any number of 3 or more, and thus the flexibility of the patterning of the wiring conductors is improved.

In the present invention, the step for creating the wiring structure may include a step for laminating a conductor material on the insulation part (lamination step), and a step for partially removing the conductor material to form a predetermined pattern of wiring conductors (removal step). In this way, the machining process for removing the conductor material laminated on the insulation part to form the wiring conductors in a predetermined pattern may be carried out using a known semiconductor manufacturing equipment such as etching, laser cutting, or punching. Therefore, it is not necessary to introduce new manufacturing equipment when creating the wiring structure, and thus the manufacturing costs can be kept low by effectively utilizing known equipment.

In the present invention, in the step for creating the wiring structure, a wiring structure in which the wiring conductors are formed in a plurality of layers may be obtained by repeating the above-described lamination step and removal step in the thickness direction. In the present invention, since the wiring conductors are formed in a planar fashion, the lamination process in the thickness direction (vertical direction) can also be easily carried out.

In the present invention, the step for creating the wiring structure may include, in addition to the above-mentioned steps, a step for layering a predetermined pattern of wiring conductors on the insulation part. In other words, the wiring conductors are created by forming wiring conductors which have been subjected to a predetermined punching in advance, and then layering the wiring conductors on the insulation part. Such a method is suited to a case in which wiring structures having the same pattern of wiring conductors are to be created in a large quantity at high speed.

In the present invention, the pattern of wiring conductors may be a pattern in which a bending point, a curving point, or a branching point exists in at least one or more locations. In the case of vertically constructing the wiring conductors as in the prior art, the wiring conductors had to be formed in a linear shape, but in the present invention, since the wiring conductors are formed in a planar fashion, the shape of the wiring conductors can be freely designed. Thus, the method of the present invention provides extremely high design flexibility for the wiring conductors (i.e. the through conductors).

In the present invention, the wiring conductors may have a protrusion which protrudes from an edge of the insulation part. The protrusion can be formed by forming the wiring conductor itself to protrude from an edge of the insulation part, or can be formed by performing a soldering or plating process on the wiring conductor which protrudes from an edge of the insulation part. In this way, by providing such protrusions to the wiring conductors, the wiring structure can be easily connected to a rewiring layer or the like.

In another embodiment of the present invention, a semiconductor device in which a circuit element is connected to a rewiring layer and a conductor is provided on the rewiring layer is manufactured. In this case as well, similar to the above-described embodiment, a wiring structure in which a predetermined pattern of wiring conductors is formed along a planar direction on an insulation part is created. Subsequently, the wiring structure is connected to the rewiring layer in a state where the wiring structure is erected vertically. Consequently, the wiring conductors are caused to function as the conductor (interposer) on the rewiring layer. In this way, a technique for forming a through conductor in an insulation layer (mold resin layer) can be applied to a technique for forming a conductor for an interposer.

Another embodiment of the present invention is a method for manufacturing a semiconductor device in which a circuit element and a through conductor connecting, in a thickness direction, a top surface and a bottom surface of an insulation layer are embedded in the insulation layer. This method for manufacturing a semiconductor device includes a step for creating a wiring structure in which a predetermined pattern of wiring conductors is formed along a planar direction on an insulation part, and a step for sealing the wiring structure in the insulation layer in a state where the wiring structure is erected vertically. Herein, the step for creating the wiring structure includes a step for preparing a plurality of predetermined patterns of wiring conductors in advance and then layering the wiring conductors so that the insulation layer is interposed between the wiring conductors. In the step for creating the wiring structure, a first wiring conductor and a second wiring conductor are in a state of being insulated from each other, and the wiring conductors function as the through conductor.

In the above-described embodiment, the step for creating the wiring structure preferably includes a step for alternately layering a conductor plate and a spacer plate. In the conductor plate, a wiring conductor part that functions as the predetermined pattern of wiring conductors is formed by providing a hole part in an interior region surrounded by a frame part, and in the spacer plate, an opening part for filling an insulation material is provided at a position overlapping the wiring conductor part of the interior region surrounded by the frame part. In this case, the step for creating the wiring structure preferably further includes a step for filling an insulation material in a fluid state into the hole part of the conductor plate and the opening part of the spacer plate, and a step for curing the insulation material in a fluid state. In this way, by using the conductor plates and the spacer plates, multiple layers of the predetermined pattern of wiring conductors and insulation layers provided therebetween can be formed collectively.

A second aspect of the present invention relates to a method for manufacturing a wiring structure. This wiring structure is to be used in the manufacture of the semiconductor device described above. In other words, the wiring structure is to be used as a through conductor for connecting, in a thickness direction, a top surface and a bottom surface of an insulation layer which constitutes the semiconductor device. The method for manufacturing a wiring structure includes a step for laminating a conductor material on an insulation part, and a step for partially removing the conductor material to form a predetermined pattern of wiring conductors. The wiring conductors formed in this way function as through conductors to be embedded in the insulation layer of the semiconductor device.

Another embodiment of the present invention relates to a method for manufacturing a wiring structure to be used as a through conductor for connecting, in a thickness direction, a top surface and a bottom surface of an insulation layer which constitutes a semiconductor device. The method for manufacturing a wiring structure includes a step for preparing a predetermined pattern of first wiring conductors in advance and layering the first wiring conductors on a layer-shaped first insulation part, and a step for layering a layer-shaped second insulation part on the first wiring conductors, preparing a predetermined pattern of second wiring conductors in advance, and layering the second wiring conductors on the second insulation part. The first wiring conductors and the second wiring conductors are in a state of being insulated from each other, and the wiring conductors function as through conductors.

Advantageous Effects of Invention

According to the present invention, when manufacturing a semiconductor device by sealing a wiring structure that functions as a through conductor in an insulation layer together with a circuit element such as a semiconductor chip, the wiring structure can be created at lower cost and the design flexibility of the through conductor can be improved.

BRIEF DESCRIPTION OF DRAWINGS

FIG. 5 shows an example of a process for manufacturing a semiconductor device.

DESCRIPTION OF EMBODIMENTS

In the following, embodiments for carrying out the present invention shall be described using drawings. The present invention is not limited to the embodiments described below, and may be appropriately modified from the embodiments below within a scope that would be obvious to a person skilled in the art.

Figure 1:
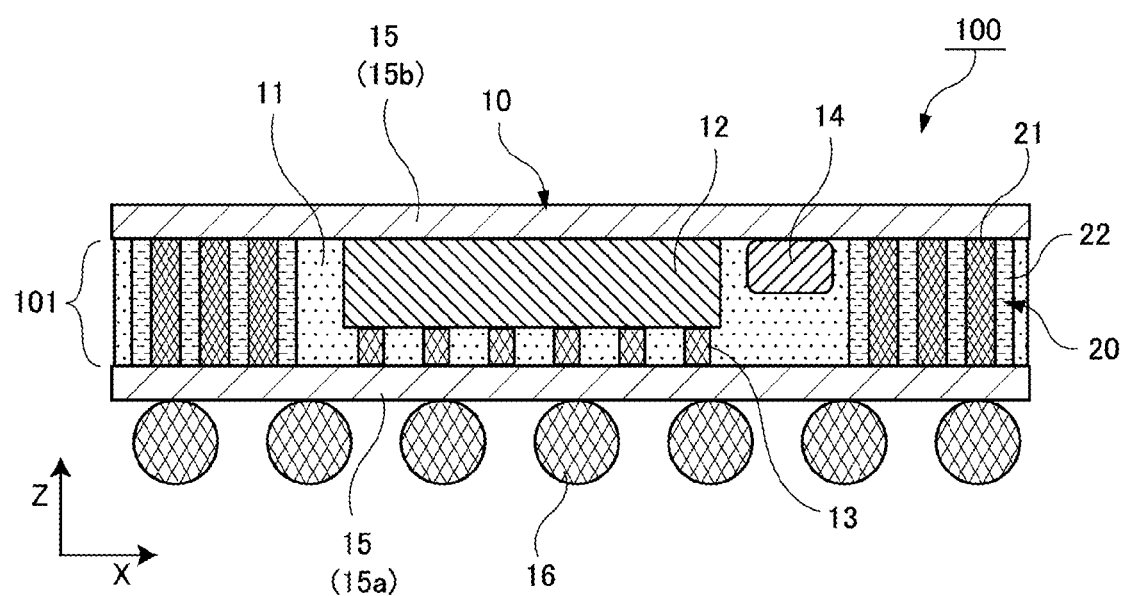
FIG. 1 shows an example of a cross-section structure of a semiconductor device according to the present invention.

FIG. 1 is a cross-section view of a semiconductor device 100 according to one embodiment of the present invention. As shown in FIG. 1, the semiconductor device 100 is a wafer level package configured to include a device body 10 and a wiring structure 20. In the present invention, the semiconductor device 100 is manufactured by creating the wiring structure 20 and the device body 10 in separate steps, and then incorporating the wiring structure 20 that was created in advance into the manufacturing process of the device body 10.

The device body 10 includes an insulation layer 11, and circuit elements that are embedded in the same plane in the insulation layer 11. In the embodiment shown in FIG. 1, the circuit elements in the insulation layer 11 include a semiconductor chip 12, electrode pads 13, and another electronic element(s) 14 such as a resistance element. The insulation layer 11 is made from, for example, a publicly-known insulation material such as a mold resin or a ceramic. An example of the semiconductor chip 12 is an active element such as LSI (Large Scale Integration), IC (Integrated Circuit), and a transistor. An example of the electronic element 14 is a passive element such as a resistance element, a capacitor, and a coil.

The wiring structure 20 has a plurality of through conductors (wiring conductors) 21 connecting, in the thickness direction, a top surface and a bottom surface of the insulation layer 11. The wiring structure 20 also includes an insulation part 22 that is interposed between the through conductors 21. The through conductors 21 are made of a material having at least one of electric conductivity and thermal conductivity. The insulation part 22 is made of a material that electrically or thermally insulates the through conductors 21 from each other. The wiring structure 20 is preferably provided at multiple locations in the insulation layer 11, and the top surface and the bottom surface of the insulation layer 11 are electrically (or thermally) connected to each other at the locations where the wiring structures 20 are disposed.

In the semiconductor device 100, a pseudo wafer structure 101 is configured by the insulation layer 11, the semiconductor chip 12, and the wiring structures 20. In the pseudo wafer structure 101, the insulation layer 11, the semiconductor chip 12, and the wiring structures 20 are formed in the same plane. Further, a rewiring layer 15 is formed on both or at least one of the top surface side and the bottom surface side of the pseudo wafer structure 101. In the embodiment shown in FIG. 1, as the rewiring layer 15, a rewiring layer 15a is provided on the bottom surface side and a rewiring layer 15b is provided on the top surface side of the pseudo wafer structure 101. A predetermined pattern of wires (not illustrated) is formed in each of the rewiring layers 15a, 15b. In the case that the rewiring layers 15a, 15b are provided on both the top surface side and the bottom surface side, the wires of the rewiring layers 15a, 15b may be connected to each other by the wiring structures 20.

A pattern of wires is formed on the bottom surface (circuit formation surface) of the semiconductor chip 12, and the electrode pads 13 are attached to these wires. The electrode pads 13 are connected to the wires of the rewiring layer 15a on the bottom surface side. Due to this configuration, the semiconductor chip 12 and the rewiring layer 15a on the bottom surface side are electrically connected. The wires of the rewiring layer 15a on the bottom surface side are connected to the through conductors 21 of the wiring structures 20. Thereby, the semiconductor chip 12 is electrically connected to an arbitrary wiring structure 20 via the rewiring layer 15a on the bottom surface side. Furthermore, the through conductors 21 of the wiring structures 20 penetrate through the insulation layer 11 in the thickness direction, and thus the rewiring layer 15a on the bottom surface side and the rewiring layer 15b on the top surface side are electrically connected to each other via the wiring structures 20. In the embodiment shown in FIG. 1, solder balls 16 are attached to the wires of the rewiring layer 15a on the bottom surface side. The solder balls 16 can be connected to, for example, a package substrate, etc. (not illustrated). The semiconductor chip 12 can also be connected to the rewiring layer 15 using a publicly-known bonding wire instead of the electrode pads 13.

Figure 2:
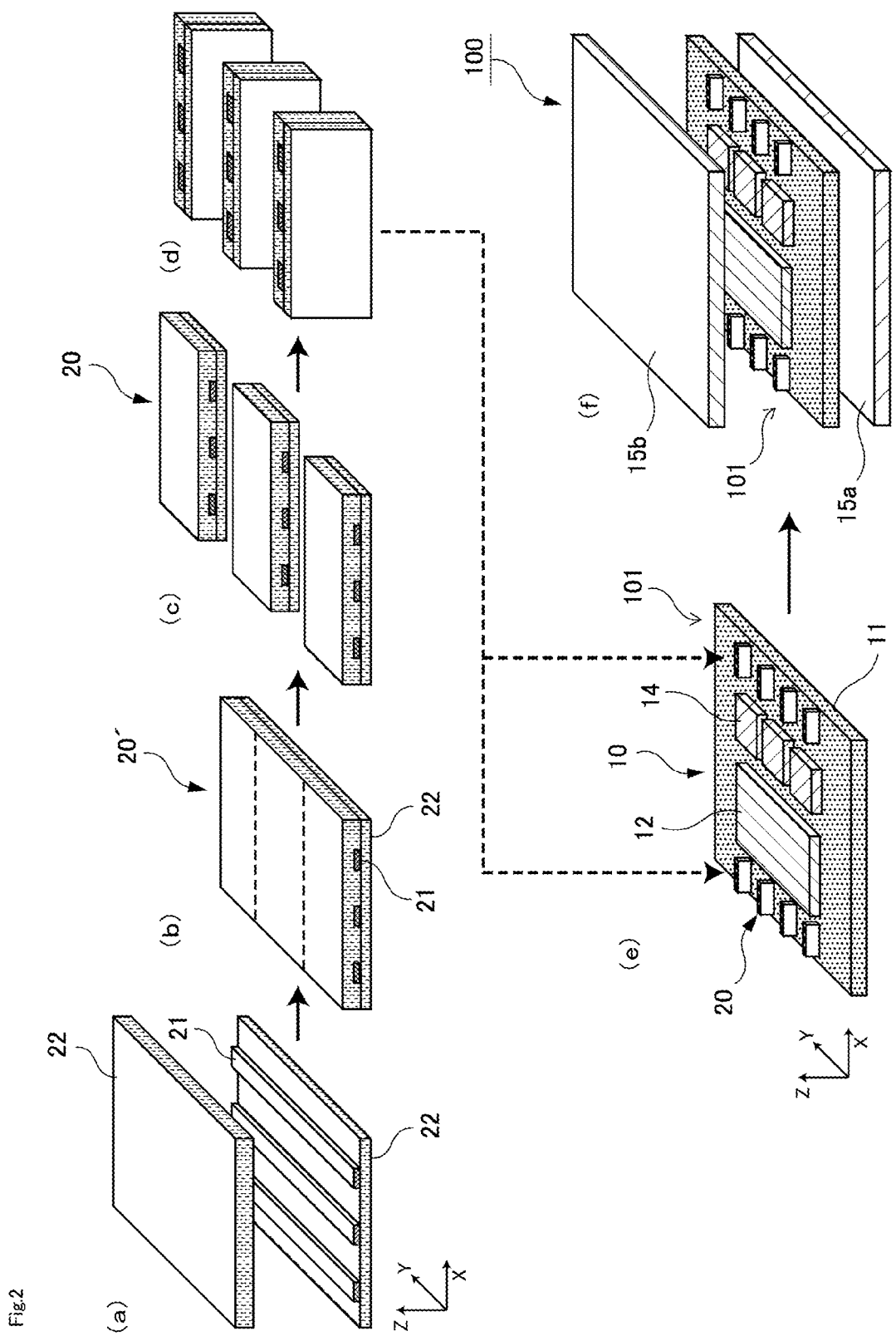
FIG. 2 shows an overview of a method for manufacturing a semiconductor device according to the present invention.

Next, the method for manufacturing the semiconductor device 100 will be explained in detail. FIG. 2 schematically illustrates an overview of the manufacturing process of the semiconductor device 100. As shown in FIG. 2, the manufacturing process of the semiconductor device 100 is divided into a process for creating the wiring structures 20 (steps (a) to (d)) and a process for manufacturing the semiconductor device 100 (wafer level package) using the wiring structures 20 (steps (e) and (f)).

In the present invention, first, the wiring structures 20 which function as through conductors (through vias) are created. As shown in FIG. 2(a), a predetermined pattern of wiring conductors 21 is formed on the layer-shaped insulation part 22 along a planar direction of the insulation part 22. In more detail, in a three-dimensional coordinate system consisting of XYZ axes, the layer-shaped insulation part 22 has a plane in the XY direction and a thickness in the Z direction. The wiring conductors 21 are formed to extend in the XY plane direction of the insulation part 22. While the wiring conductors 21 do have some degree of thickness in the Z direction, the wiring conductors 21 do not extend in the Z direction and extend in the XY plane direction. In the example shown in FIG. 2(a), the wiring conductors 21 are formed in a linear shape extending in the Y direction, but the shape of the wiring conductors 21 is not limited thereto. For example, the wiring conductors 21 can also be freely designed in a linear shape extending in the X direction or a linear shape extending in a diagonal direction, or in a shape having a bending point, a curving point, or a branching point at one or more locations. Further, the wiring conductors 21 can be freely arranged in two or more rows, three or more rows, or four or more rows in the XY plane.

As shown in FIG. 2(b), after the pattern of wiring conductors 21 has been formed, another layer-shaped insulation part 22 is further layered onto the wiring conductors 21, and thereby the wiring conductors 21 are sealed by the insulation parts 22. Due to this configuration, a pseudo wafer 20' in a state before being split into the wiring structures 20 is obtained. In the example explained herein, the wiring conductors 21 were formed in only a single layer, but multiple layers of the wiring conductors 21 can be formed in the Z direction.

Next, as shown in FIG. 2(c), the pseudo wafer 20' is diced into an arbitrary size to create individual wiring structures 20. The wiring structure 20 is a conductor that electrically or thermally connects two or more arbitrary locations. Therefore, each wiring structure 20 is preferably configured such that the wiring conductors 21 are exposed at two or more end surfaces of the wiring structure 20 (the surfaces forming the thickness of the wiring structure 20). As used herein, "exposed" means that the wiring conductors 21 can be accessed from the end surface of the wiring structure 20. A state in which the wiring conductors 21 are exposed includes a state in which the ends of the wiring conductors 21 coincide with the end surface of the wiring structure 20, a state in which the ends of the wiring structure 20 protrude from the end surface of the wiring structure 20, and a state in which the ends of the wiring structure 20 are recessed relative to the end surface of the wiring structure 20 but the recessed part is not filled with an insulation material. Even if the wiring conductors 21 are not exposed from the end surface of the wiring structure 20 at this stage, the wiring conductors 21 can be exposed from the end surface of the wiring structure 20 by grinding the end surface of the wiring conductors 21 in the subsequent manufacturing process.

Subsequently, as shown in FIGS. 2(*d*) and 2(*e*), the wiring structures 20 are disposed around the semiconductor chip 12, etc. in a state in which the wiring structures 20 are erected vertically, and then the wiring structures 20 are sealed together with the semiconductor chip 12, etc. in the insulation layer 11 (for the convenience of illustration, FIG. 2(*e*) depicts the wiring structures 20, etc. as being disposed on the insulation layer 11, but in reality, the wiring structures 20, etc. are embedded in the insulation layer 11). Thereby, the pseudo wafer structure 101 is formed. The wiring conductors 21 should be erected vertically immediately before being disposed around the semiconductor chip 12, etc. In other words, in the course of manufacturing the wiring structures 20, the wiring conductors 21 extend in the XY plane direction, but when the wiring structures 20 are embedded together with the semiconductor chip 12 in the insulation layer 11, the wiring conductors 21 extend in the Z direction (specifically, the ZY plane direction or the ZX plane direction). In this way, the orientation of the wiring structures 20 is changed before sealing the wiring structures 20 in the insulation layer 11, and thus the wiring conductors 21 of the wiring structures 20 penetrate through the insulation layer 11 in the thickness direction. The wiring conductors 21 of the wiring structures 20 function as through conductors (through vias) in the semiconductor device 100. For example, as shown in FIG. 2(*f*), the rewiring layers 15*a*, 15*b* are formed on the bottom surface side and the top surface side, respectively, of the pseudo wafer structure 101. In this case, the wiring conductors 21 (through conductors) electrically (or thermally) connect the rewiring layer 15*a* on the bottom surface side and the rewiring layer 15 on the top surface side. Due to this configuration, one feature of the present invention is that the wiring conductors 21 formed in a planar fashion are erected vertically to be used as through conductors.

Figure 3:
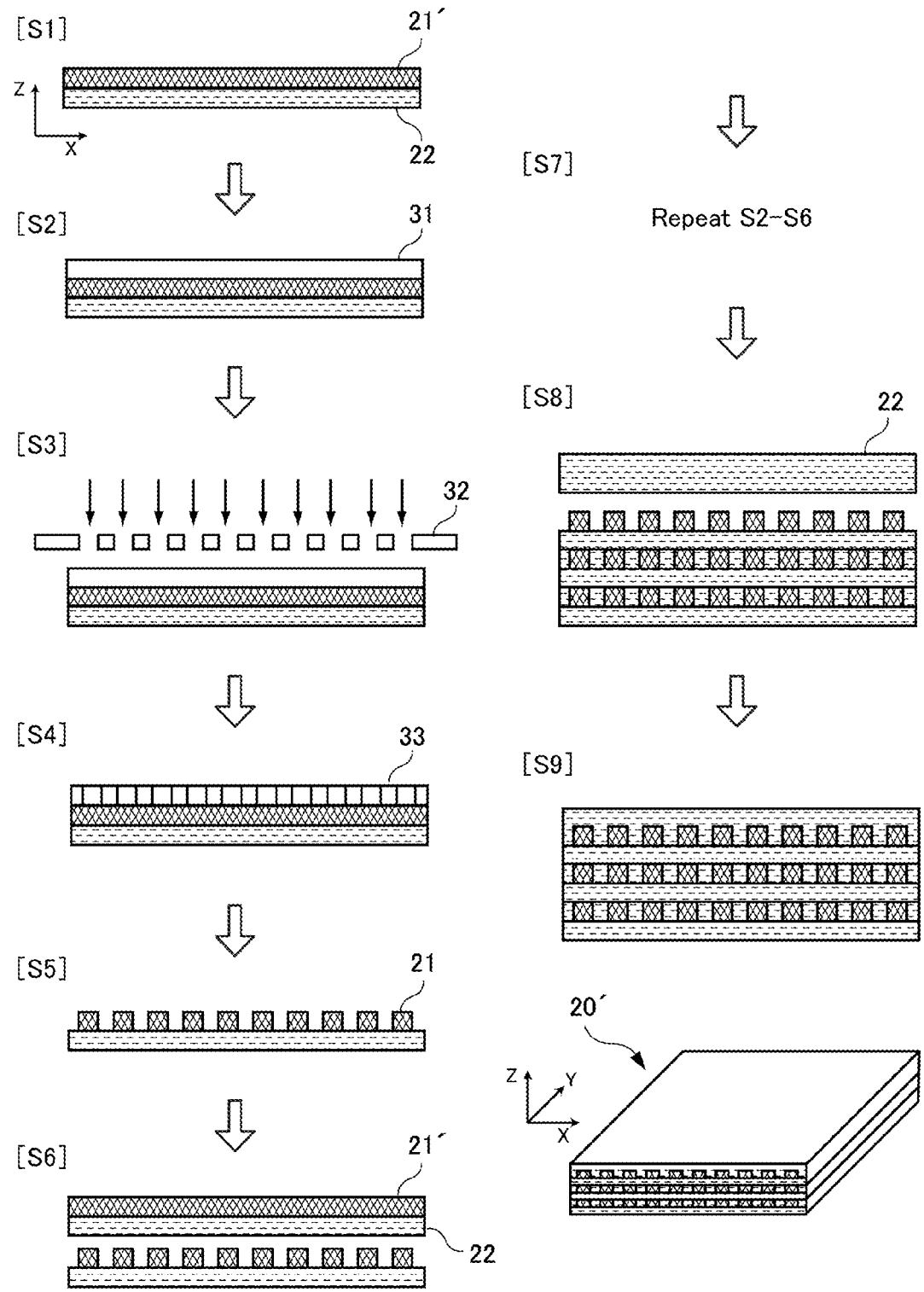
FIG. 3 shows an example of a process for creating a wiring structure.
Figure 4:
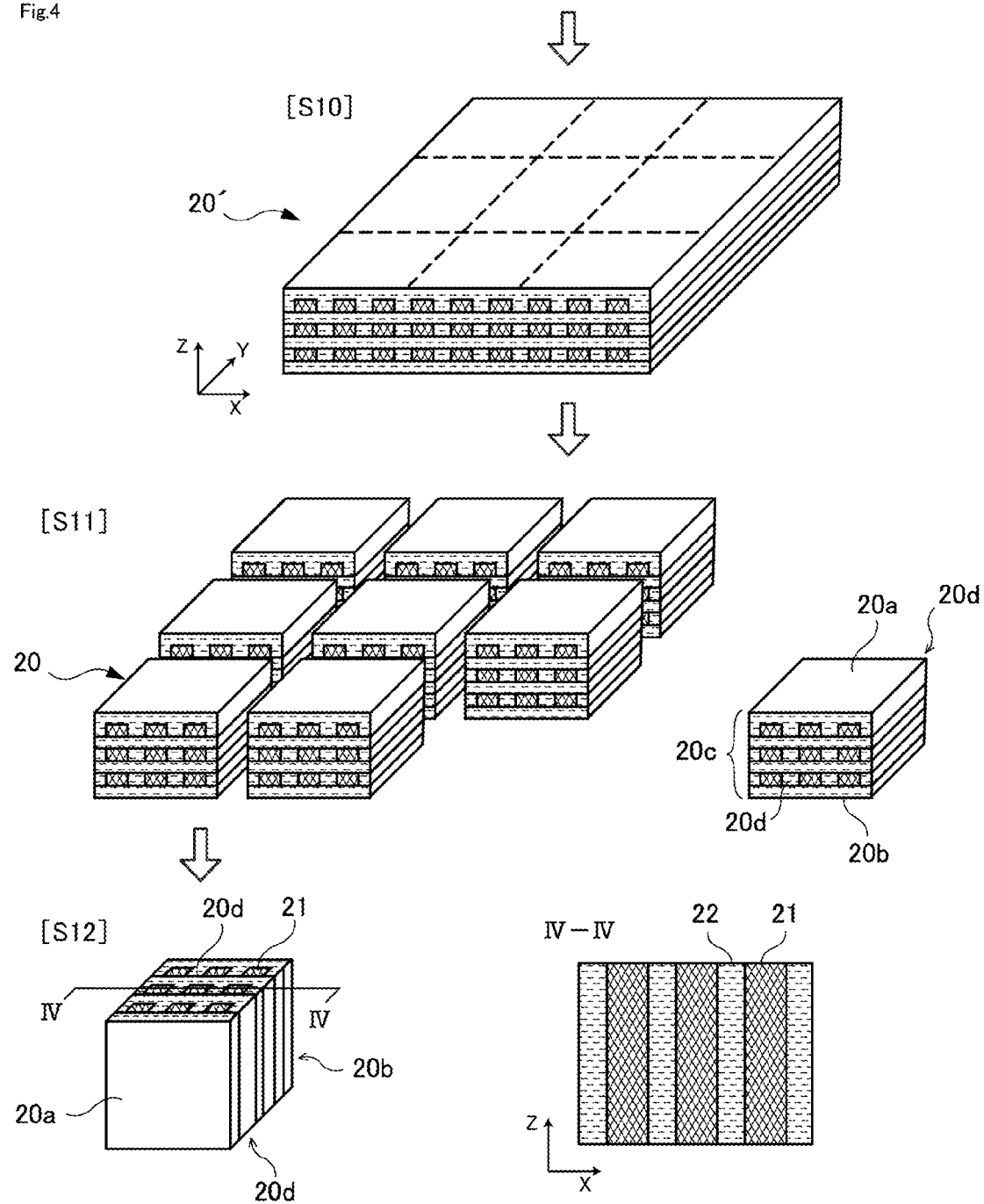
FIG. 4 shows an example of a process for creating a wiring structure.

Next, a concrete example of a method for creating the wiring structures 20 shall be explained referring to FIGS. 3 and 4. First, a layer of conductor material 21' for forming the wiring conductors 21 is laminated on a layer of insulation material which constitutes the insulation part 22 (step S1). At this time, the thicknesses of the layer of insulation material and the layer of conductor material 21' should each be set to conform to the pitch of the through conductors to be ultimately obtained. As the insulation material (insulation part 22), a publicly-known electrical insulation material such as a mold resin or a ceramic can be used. Examples of the mold resin include a thermosetting resin such as an epoxy resin, a polyimide resin, a phenol resin, and a cyanate resin, and a composite resin obtained by mixing an inorganic filler such as aluminum oxide, silica (silicon dioxide), and titanium dioxide into such a thermosetting resin. Further, as the conductor material 21', a publicly-known electrically conductive and thermally conductive material such as a metal can be used. Examples of the conductor material 21' include copper (Cu), silver (Ag), aluminum (Al), etc. After the conductor material 21' is laminated onto the layer of insulation material, a heat treatment is carried out to cure the layer of insulation material, and thereby the conductor material 21' and the insulation part 22 are integrated.

Next, a photosensitive mask sheet 31 is adhered to the layer of conductor material 21' (step S2). As the mask sheet 31, a publicly-known photosensitive dry film can be used. Further, instead of using the mask sheet 31, a photosensitive resist agent may be applied onto the layer of conductor material 21'.

Next, the mask sheet 31 is exposed using a photoscreen 32 in which a predetermined pattern of openings is formed (step S3). In this step, the pattern of openings of the photoscreen 32 matches the pattern of the wiring conductors 21 to be ultimately obtained. The opening pattern of the photoscreen 32 is not limited to being linear, and patterns having bending points, curving points, or branching points may be freely selected. Further, instead of using the photoscreen 32, the mask sheet 31 may be exposed by directly irradiating a laser onto the mask sheet 31. In this case, the pattern of the wiring conductors 21 can be directly drawn using the laser.

Next, a resist mask 33 having a predetermined pattern is formed by developing the exposed mask sheet 31 (step S4). The resist mask 33 covers the portions corresponding to the wiring conductors 21 to be ultimately obtained.

Next, the conductor material 21' to which the resist mask 33 is adhered is contacted to an etching liquid, and the conductor material 21' is etched according to the pattern of the resist mask 33 (step S5). The etching liquid may be appropriately selected according to the type of conductor material 21'. Thereby, the predetermined pattern of wiring conductors 21 is formed on the layer of insulation material (insulation part 22).

Next, another layer of insulation material (insulation part 22) and another layer of the conductor material 21' are further laminated on the wiring conductors 21 (step S6). At this time, the insulation material on the top layer is filled between the wiring conductors 21 on the bottom layer to ensure the insulation state in the planar direction. Further, the insulation material is disposed between the wiring conductors 21 on the bottom layer and the conductor material 21' on the top layer so that the wiring conductors 21 on the bottom layer and the conductor material 21' on the top layer do not contact each other, and thus the insulation state in the thickness direction is also ensured. After the insulation material and the conductor material 21' are laminated in this order on the wiring conductors 21 as described above, the insulation material is cured, and thereby the wiring conductors 21 become surrounded by the insulation material.

Next, the processes of the above-described steps S2 to S6 are repeated for the required number of layers of the wiring conductors 21 (step S7). For example, the number of layers of the wiring conductors 21 is preferably 2 or more or 3 or more, and the upper limit thereof is not particularly limited. For example, 10 or more layers of the wiring conductors 21 can be formed. The patterns of the wiring conductors 21 can be unified across the layers of the wiring conductors 21, or the pattern of the wiring conductors 21 can be changed in each layer. For example, the layers can be formed such that the wiring conductors 21 of the bottom layer and the wiring conductors 21 of the top layer are different from each other.

Next, after the required number of layers of the wiring conductors 21 has been laminated, a layer of the insulation material (insulation part 22) is laminated and cured so as to cover the topmost layer of the wiring conductors 21 (step S9). In this way, the pseudo wafer 20' in a state before being split into the wiring structures 20 is obtained. The pseudo wafer 20' of the wiring structures 20 is basically patterned such that the insulation part 22 and the wiring conductors 21 are repeatedly laminated in order and the wiring conductors 21 extend along the planar direction of the insulation part 22.

Next, as shown in FIG. 4, the pseudo wafer 20' for the wiring conductors 21 is diced into an arbitrary size using a publicly-known dicing saw (step S10). The dicing direction may be only either one of the X direction and the Y direction in the planar direction, or may be both the X direction and the Y direction. Thereby, a plurality of the wiring conductors 21 split from the pseudo wafer 20' can be cut off (step S11). The wiring structures 20 are basically configured so that the dicing cut surface becomes an end surface that forms the thickness of the wiring structure 20. Further, the wiring conductors 21 are exposed from at least two surfaces among the end surfaces of the wiring structure 20.

The wiring structures 20 obtained as described above are used to manufacture the semiconductor device 100 described below. When incorporating the wiring structures 20 into the semiconductor device 100, the orientation of the wiring structures 20 is changed so that the wiring structures 20 are in a vertically erected state (step S12).

In further detail, as shown in FIG. 4, each wiring structure 20 which has been split is a rectangular parallelepiped body having six quadrangular surfaces. The lamination direction of the conductor material and the insulation material becomes the thickness direction of the wiring structure 20. The wiring structure 20 has a top surface 20a and a bottom surface 20b which face each other in the thickness direction, and also has four end surfaces 20c that connect the top surface 20a and the bottom surface 20b. Among the four end surfaces 20c of the wiring structure 20, at least two mutually opposing surfaces are exposed surfaces 20d at which the wiring conductors 21 are exposed. As shown in FIG. 4, in the case that the patterns of the wiring conductors 21 are formed linearly along the Y direction, the wiring conductors 21 are exposed from only two mutually opposing end surfaces (exposed surfaces 20d) of the four end surfaces 20c of the wiring structure 20. However, depending on the patterns of the wiring conductors 21, three out of the four end surfaces of the wiring conductors 21 may become exposed surfaces 20d, or all four of these surfaces may become exposed surfaces 20d. Further, vertically erecting the wiring structure 20 means that the two exposed surfaces 20d at which the wiring conductors 21 are exposed are oriented downwards and upwards in the vertical direction so that the original top surface 20a and the original bottom surface 20b are erected vertically. Due to this configuration, the wiring conductors 21 within the wiring structure 20 also extend in the vertical direction. In FIG. 4, a cross section of the wiring structure 20 in a vertically erected state is shown for reference.

As shown in step S12 of FIG. 4, in the wiring structure 20 in a vertically erected state, three rows of the wiring conductors 21 are formed in the X direction and three columns of the wiring conductors 21 are formed in the Y direction. The number of rows of the wiring conductors 21 corresponds to the number of rows of the wiring conductors 21 formed in a plane on the insulation part 22 in step S5, and the number of columns of the wiring conductors 21 corresponds to the number of layers of the wiring conductors 21 that were repeatedly laminated in step S7. In this way, the number of rows of the wiring conductors 21 is not limited to three, and 4 or more or 10 or more rows can be created. Similarly, the number of columns of the wiring conductors 21 is not limited to three, and 4 or more or 10 or more columns can be created.

As explained above, in the present invention, the wiring structures 20 are created in advance. In the above example, the wiring conductors 21 in the wiring structure 20 were patterned by means of an etching process, but the present invention is not limited thereto, and the wiring conductors 21 may be patterned using a publicly-known method such as laser cutting or punching.

Next, a concrete example of the method for manufacturing the semiconductor device 100 using the wiring structures 20 will be explained referring to FIGS. 5 and 6. First, a wafer carrier 40 in which an adhesive layer 42 is provided on the surface of a support substrate 41 is prepared (step S13). As the support substrate 41, a publicly-known material such as stainless steel, aluminum, silicon, and glass can be used. The adhesive layer 42 should have an adhesive strength capable of temporarily holding the semiconductor chip 12, the wiring structures 20, and the like, and, for example, a double-sided adhesive tape can be used. As such an adhesive tape, a heat-foamable adhesive tape or an adhesive tape whose adhesive strength is reduced by ultraviolet radiation can be used.

Next, the wiring structures 20, the semiconductor chip 12, and the other electronic element(s) 14 are mounted on the adhesive layer 42 of the wafer carrier 40, and these elements are temporarily adhered to the support substrate 41 via the adhesive layer 42 (step S14). At this time, the wiring structures 20 are attached to the support substrate 41 via the adhesive layer 42 in a state in which the wiring structures 20 are erected vertically relative to the support substrate 41. In other words, an end surface (exposed surface) at which the wiring conductors 21 are exposed of the wiring structure 20 is adhered to the adhesive layer 42, and thereby the extension direction of the wiring conductors 21 in the wiring structure 20 becomes vertical relative to the support substrate 41. Further, a pattern of wires is formed on the circuit formation surface of the semiconductor chip 12, and the electrode pads 13 are attached to these wires. At the stage of step S14, the surface of the semiconductor chip 12 on the side opposite the circuit formation surface is attached to the support substrate 41 via the adhesive layer 42. In addition to the wiring structures 20 and the semiconductor chip 12, an arbitrary electronic element(s) 14 such as a resistance element may be mounted on the support substrate 41.

Figure 6:
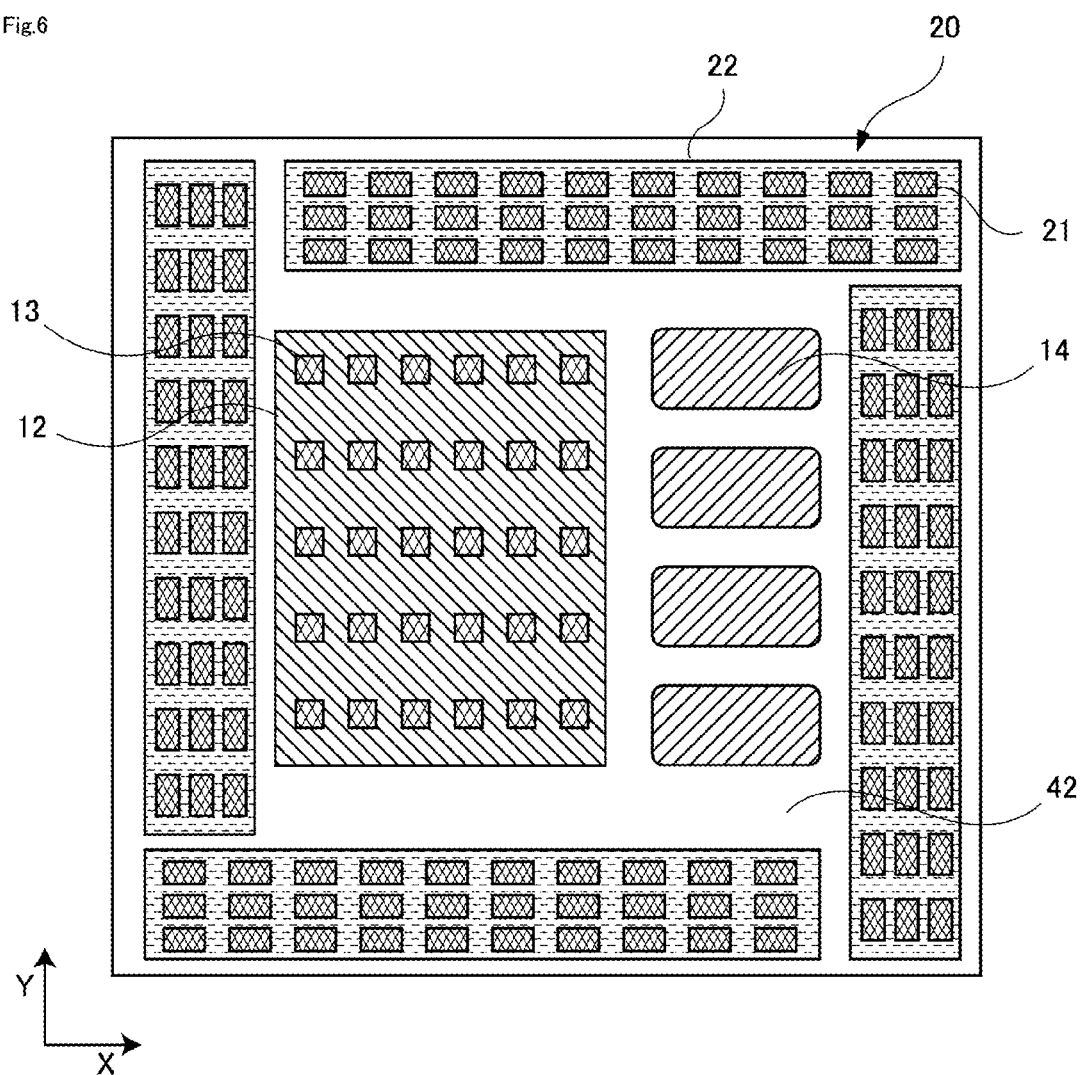
FIG. 6 is a plan view showing an example arrangement of a semiconductor chip, an electronic element, and a wiring structure.

FIG. 6 is one example of a plan view showing the state at step S14. In the example shown in FIG. 6, a wiring structure 20 in which 10 layers of the wiring conductors 21 are formed is used, and a total of four of these wiring structures 20 are disposed around the semiconductor chip 12 and the electronic elements 14. In other words, the semiconductor chip 12 and the plurality of the electronic elements 14 are disposed in the center of the wafer carrier 40, and four of the wiring structures 20 are disposed in a vertical state along the four sides of the wafer carrier 40 so as to surround the semiconductor chip 12 and the plurality of the electronic elements 14. The number of the semiconductor chip 12 and the wiring structures 20 to be temporarily adhered to the wafer carrier 40 can be appropriately changed according to the specifications of the semiconductor device 1 to be manufactured. In this way, in the step (step S14) in which the wiring structures 20 are mounted onto the wafer carrier 40, the lamination direction of the layers of the wiring conductors 21 (i.e. the thickness direction of the wiring structures 20) coincides with the planar direction (XY direction) of the wafer carrier 40.

Next, an insulation material such as a mold resin for forming the insulation layer 11 is supplied onto the adhesive layer 42 of the wafer carrier 40. As the insulation material to be used herein, similar to the insulation part 22 described above, a thermosetting resin or a composite resin obtained by mixing an inorganic filler into such a thermosetting resin, etc. can be used. The wiring structures 20 and the semiconductor chip 12, etc. which are mounted on the wafer carrier 40 are embedded in the insulation material such as a mold resin, and thereby sealed in the insulation layer 11 (step S15). The insulation layer 11 is then cured by a treatment such as hot-pressing. As a result, the pseudo wafer structure 101 in which the semiconductor chip 12, the electronic elements 14, and the wiring structures 20 are formed in the same plane is obtained. Further, the insulation part 22 which constitutes the wiring structures 20 and the insulation layer 11 formed on the wafer carrier 40 are integrated in this step.

When filling the mold resin, etc. on the wafer carrier 40, the resin is fluid and thus may sweep away the wiring structures 20. With regard to this point, in the present invention, the end surface of each wiring structure 20 that is temporarily adhered to the wafer carrier 40 is a flat surface, and the end surface is temporarily adhered with sufficient strength to the adhesive layer 42 of the wafer carrier 40. Therefore, even if the resin is fluid, the wiring structures 20 can be kept at the prescribed positions on the wafer carrier 40 without being swept away. Further, since the wiring structures 20 are configured with a structure in which the insulation part 22 is interposed between the wiring conductors 21, the insulation part 22 functions as a spacer that maintains the gaps between the wiring conductors 21. Therefore, even if the resin is flowing, the positions of the wiring conductors 21 do not deviate, and the wiring conductors 21 can be prevented from contacting each other. Due to the above, a high-precision semiconductor device in which the wiring conductors 21 are aligned with a narrow pitch can be accurately manufactured.

Next, the insulation layer 11 is ground from the top surface side of the pseudo wafer structure 101 so as to expose the wiring conductors 21 of the wiring structures 20 and the electrode pads 13 of the semiconductor chip 12 that are sealed within the insulation layer 11 (step S16). At this time, a portion of the wiring structures 20 and a portion of the electrode pads 13 may be ground together with the insulation layer 11. If the wiring conductors 21 of the wiring structures 20 are completely covered by the insulation part 22, the wiring conductors 21 can also be exposed by grinding the wiring structures 20 in step S16.

Next, a first rewiring layer 15a is formed on the ground surface of the pseudo wafer structure 101 (step S17). In the first rewiring layer 15a, for example, wires (not illustrated) are formed on the wiring conductors 21 of the wiring structures 20 and the electrode pads 13 of the semiconductor chip 12 that were exposed at the ground surface of the pseudo wafer structure 101, so as to create electrical connections between arbitrary electrode pads 13 and arbitrary wiring conductors 21. A publicly-known method may be used as the method for forming the rewiring layer 15a. For example, the rewiring layer 15a may be formed by forming a plating resist on the entire ground surface of the pseudo wafer structure 101 and then patterning the plating resist to have predetermined wire-shaped openings, and subsequently forming a seed layer or the like and performing an electrolytic plating process or an electroless plating process, etc.

Next, the pseudo wafer structure 101 on which the first rewiring layer 15a has been formed is peeled off from the wafer carrier 40 (step S18). For example, if the adhesive layer 42 of the wafer carrier 40 was formed with a heat-foamable adhesive tape, the pseudo wafer structure 101 can be easily peeled off from the wafer carrier 40 by heating the adhesive layer 42 to foam the adhesive tape. After the pseudo wafer structure 101 has been peeled off from the wafer carrier 40, the pseudo wafer structure 101 is flipped over so that the peeled surface is facing upwards.

Next, a second rewiring layer 15b is formed on the peeled surface of the pseudo wafer structure 101 (step S19). In the second rewiring layer 15b, for example, wires (not illustrated) are formed on the wiring conductors 21 of the wiring structures 20 and the electronic elements 14 that were exposed at the peeled surface of the pseudo wafer structure 101, so as to create electrical connections between arbitrary electronic elements 14 and arbitrary wiring conductors 21. The second rewiring layer 15b may be formed with the same method as that used for the first rewiring layer 15a explained in step S17. Thereby, the first rewiring layer 15a and the second rewiring layer 15b are electrically connected by the wiring conductors 21 of the wiring structures 20. In other words, the wiring conductors 21 of the wiring structures 20 penetrate through the insulation layer 11 in the thickness direction, and function as "through conductors" for connecting the rewiring layers 15a, 15b provided on the top and bottom surfaces of the insulation layer 11. The through conductors (wiring conductors 21) are not limited to connecting the rewiring layers 15a, 15b on the top and bottom surfaces, and, for example, the through connectors may directly connect the rewiring layer and the solder balls.

Next, in the example shown in FIG. 5, the solder balls 16 are attached to the first rewiring layer 15a (step S20). After this step, the semiconductor device 100 according to the present embodiment is complete. The solder balls 16 can be used when connecting the semiconductor device 100 to another package substrate, etc. (not illustrated).

In the example explained referring to FIG. 1 and FIG. 5, etc., a structure in which the semiconductor chip 12 is embedded in the insulation layer 11 was shown, but the semiconductor chip 12 does not necessarily have to be embedded in the insulation layer 11. For example, it is possible to embed only the (one or a plurality of) electronic element(s) 14 such as a resistance element in the insulation layer 11, and then attach the semiconductor chip 12 onto the rewiring layer 15b on the top surface side. Conversely, it is also possible to embed only the semiconductor chip 12 in the insulation layer 11, and then attach the electronic element(s) 14 such as a resistance element onto the rewiring layer 15b on the top surface side.

As explained above, in the present invention, the process for creating the wiring structures 20 having the wiring conductors 21 which function as through conductors is separate from the process for manufacturing the semiconductor device (wafer level package). Further, the wiring structures 20 are created by forming the wiring conductors 21 along the planar direction and then laminating the wiring conductors 21 in the thickness direction. Therefore, the shape, arrangement, pitch, and the like of the wiring conductors 21 in the plane can be designed with relative flexibility. In the following, examples of the wiring conductors 21 of the wiring structure 20 shall be explained in further detail.

Figure 7:
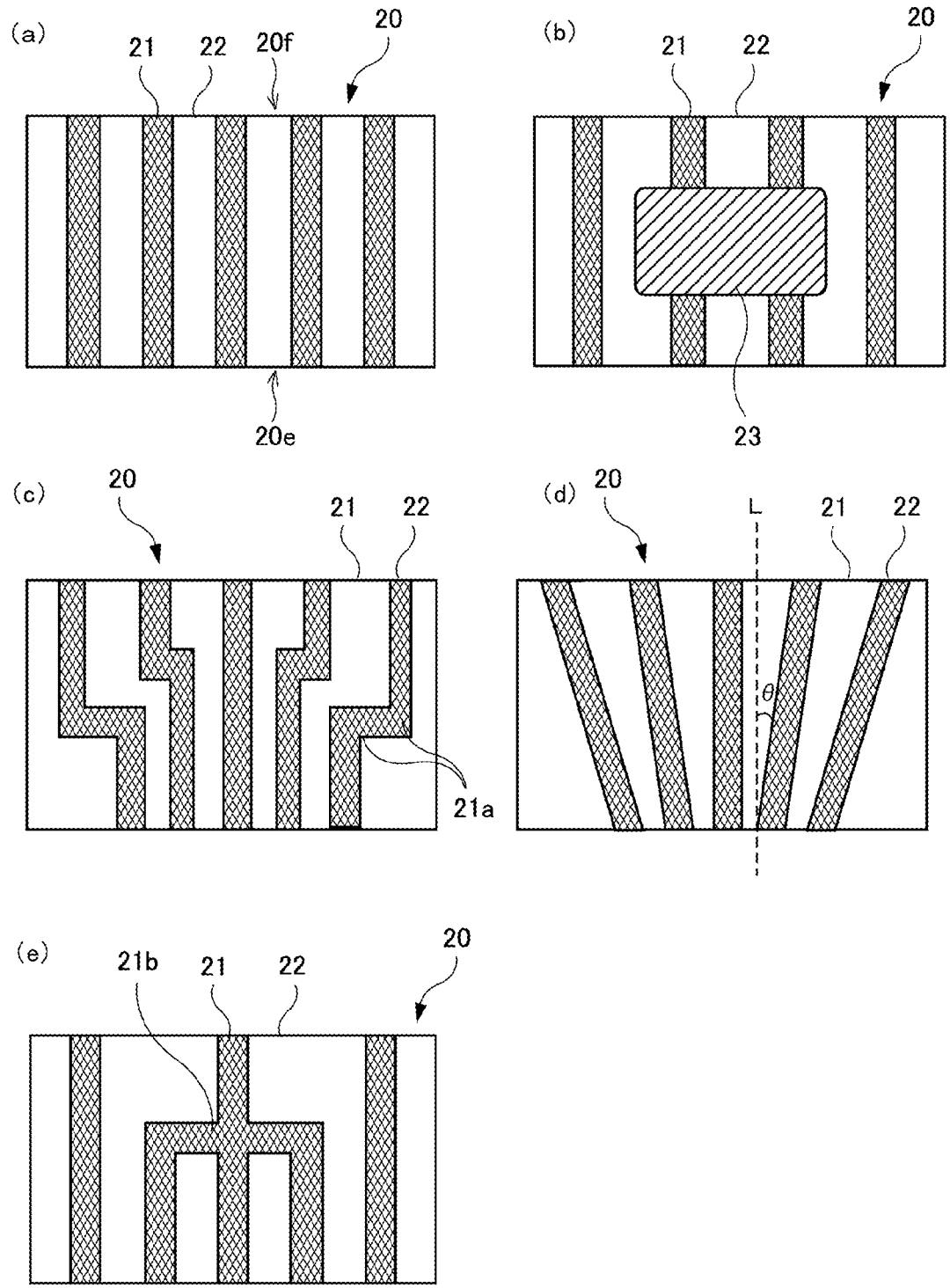
FIG. 7 shows example patterns of wiring conductors in the wiring structure.

FIG. 7 shows cross-section views of the wiring structure 20, and illustrates various patterns of the wiring conductors 21 (through conductors). FIG. 7(a) shows a normal pattern in which a plurality of linear wiring conductors 21 are formed in parallel. In the pattern of FIG. 7(a), the plurality of wiring conductors 21 extend linearly from one end surface to the other opposing end surface of the wiring structure 20. In the following, the end surface positioned on the bottom side in the drawings among the mutually opposing end surfaces of the wiring structure 20 at which the wiring conductors 21 are exposed will be referred to as the "bottom-side exposed surface 20e" and the end surface positioned on the top side in the drawings will be referred to as the "top-side exposed surface 20f".

FIG. 7(b) shows a pattern in which the linear wiring conductors 21 are formed in parallel as in FIG. 7(a), and then an electronic element 23 is further embedded so as to intersect one or more of the wiring structures 20. Examples of the electronic element 23 include a resistance element, a capacitor, a coil, and the like. The electronic element 23 is disposed in the same plane as the wiring conductors 21 and is sealed in the insulation part 22 together with the wiring conductors 21. In other words, the electronic element 23 is electrically connected to the rewiring layer, etc. via the wiring conductors 21. Due to this configuration, various functions such as resistance can be imparted to the wiring structure 20 itself.

FIG. 7(c) shows a pattern including wiring conductors 21 which are wired in a crank shape. A crank shape is a shape in which the wiring conductor 21 has two or more bending points 21a (or curving points), and the wiring path from the bottom-side exposed surface 20e to the top-side exposed surface 20f is bent at two or more places therein. In the pattern of FIG. 7(c), the center wiring conductor 21 is formed linearly, but the plurality of wiring conductors 21 that are positioned toward the left or right sides from the center are formed in a crank shape having two bending points 21a each. The pitch between the wiring conductors 21 is relatively narrow at the bottom-side exposed surface 20e, but is relatively wide at the top-side exposed surface 20f. By forming the wiring conductors 21 in a crank shape in this way, the pitch between the wiring conductors 21 can be converted.

FIG. 7(d) shows a different method for pitch conversion of the wiring conductors 21. In the pattern of FIG. 7(d), all of the wiring conductors 21 are formed linearly, but there are wiring conductors 21 that are inclined by a predetermined angle $\theta$ relative to a reference imaginary line L which connects the bottom-side exposed surface 20e and the top-side exposed surface 20f in the shortest possible distance. In other words, the wiring conductor 21 positioned at the center extends parallel to the reference imaginary line L, but the plurality of wiring conductors 21 positioned toward the left and right sides from the center are inclined by a predetermined angle $\theta$ relative to the reference imaginary line L. Further, the inclination angle $\theta$ increases the farther the wiring conductor 21 is positioned toward the outside on the right or left. In this pattern as well, the pitch of the wiring conductors 21 can be converted between the bottom-side exposed surface 20e and the top-side exposed surface 20f of the wiring structure 20.

FIG. 7(e) shows a pattern comprising a wiring conductor 21 having a branching point 21b. In the pattern of FIG. 7(e), the wiring conductor 21 positioned at the center has a branching point 21b in the wiring path from the top-side exposed surface 20f toward the bottom-side exposed surface 20e. The wiring conductor 21 positioned at the center branches at the branching point 21b into three wiring paths from a single wiring path. Therefore, when viewing the overall wiring structure 20, the wiring conductors 21 are exposed at three places at the top-side exposed surface 20f, whereas the wiring conductors 21 are exposed at five places at the bottom-side exposed surface 20e. In this way, the wiring conductors 21 can be branched for the purpose of, for example, strengthening the ground or the like. Alternatively, the pattern of FIG. 7(e) can be adopted for the purpose of merging a plurality of wiring conductors 21 into a single wiring path.

Figure 8:
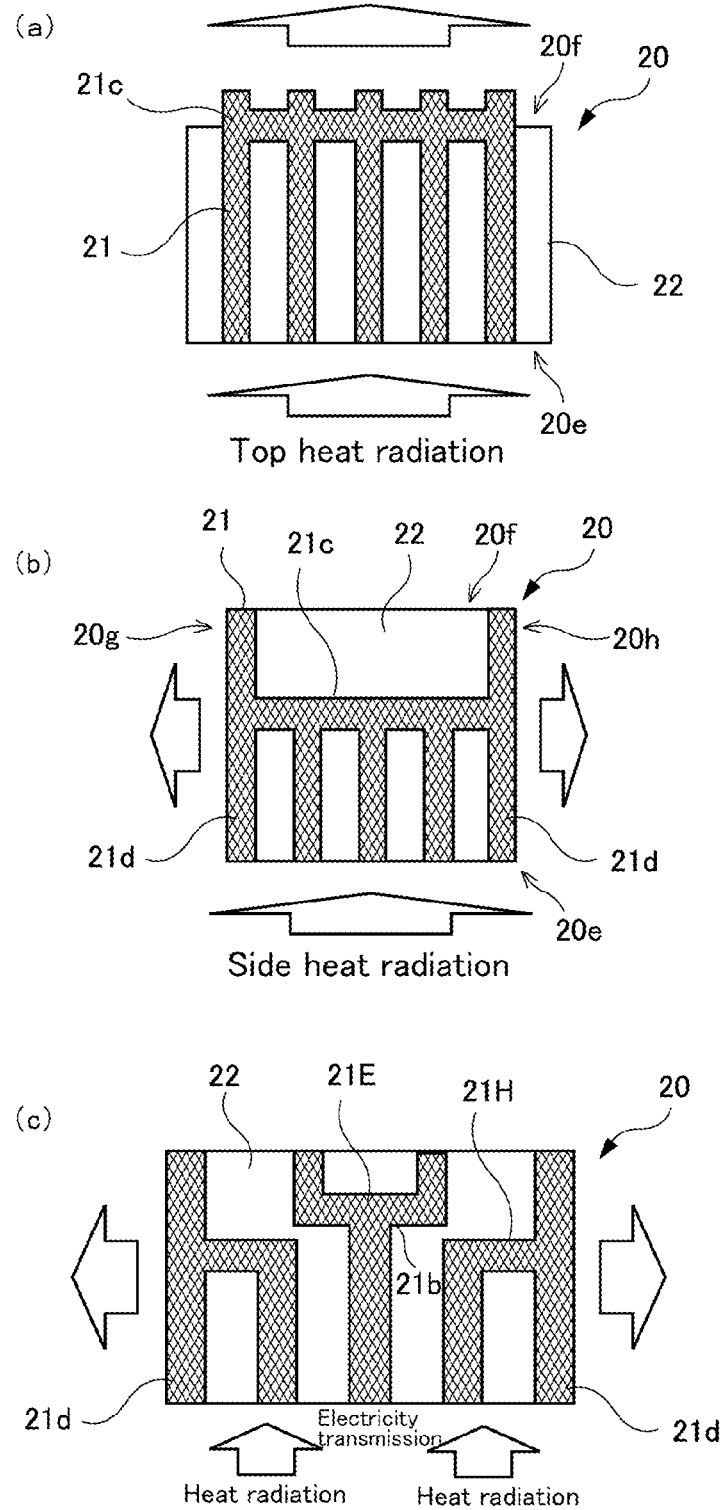
FIG. 8 shows example patterns of wiring conductors when the wiring structure is used as a heat radiating element.

Next, referring to FIG. 8, examples of patterns of the wiring conductors 21 in the case that the wiring structure 20 is used for the purpose of heat radiation will now be explained. The wiring conductors 21 of the wiring structure 20 can also be formed using thermal conductors. In this case, the wiring structure 20 functions as a heat radiating element.

FIG. 8(a) shows a pattern of the wiring conductors 21 for the purpose of top heat radiation. In the pattern of FIG. 8(a), a plurality of linear wiring conductors 21 arranged in parallel to each other protrude from the top-side exposed surface 20f, and the sites at which the wiring conductors 21 protrude are joined by a joining wiring conductor 21c that is formed along the top-side exposed surface 20f. The joining wiring conductor 21c is formed from a thermally conductive material similar to the other wiring conductors 21. The joining wiring conductor 21c should be formed in a planar fashion along the top-side exposed surface 20f. Due to this configuration, for example, heat that has accumulated in the wiring conductors 21 from the bottom-side exposed surface 20e is radiated from the joining wiring conductor 21c provided on the top-side exposed surface 20f.

FIG. 8(b) shows a pattern of the wiring conductors 21 for the purpose of side heat radiation. The pattern of FIG. 8(b) includes side wiring conductors 21d that are exposed along end surfaces 20g, 20h on the left and right sides of the wiring structure 20. At the bottom-side exposed surface 20e, a total of five linear wiring conductors 21 are exposed, including the two side wiring conductors 21d. The five wiring conductors 21 are joined by a joining wiring conductor 21c that extends laterally near the center of the wiring structure 20. Due to this configuration, for example, heat that has accumulated in the wiring conductors 21 from the bottom-side exposed surface 20e passes through the joining wiring conductor 21c and is radiated from the side wiring conductors 21d that are exposed along the left and right end surfaces 20g, 20h.

FIG. 8(c) shows a pattern in which both an electricity-transmitting wiring conductor 21E and heat-radiating wiring conductors 21H are formed. The electricity-transmitting wiring conductor 21E creates a wiring path that connects the bottom-side exposed surface 20e and the top-side exposed surface 20f. As in the pattern shown in FIG. 8(c), a branching point 21b may be provided to the wiring path of the electricity-transmitting wiring conductor 21E. On the other hand, the heat-radiating wiring conductors 21H include the side wiring conductors 21d that are exposed along the end surfaces 20g, 20h on the left and right sides of the wiring structure 20. The wiring paths of the heat-radiating wiring conductors 21H are wired so as to connect to the side wiring conductors 21d. As shown in FIG. 8(c), the electricity-transmitting wiring conductor 21E and the heat-radiating wiring conductors 21H are separated by the insulation part 22, and thus are not electrically and thermally connected to each other. In this way, both the electricity-transmitting wiring conductor 21E and the heat-radiating wiring conductors 21H can be provided in a single wiring structure 20.

Figure 9:
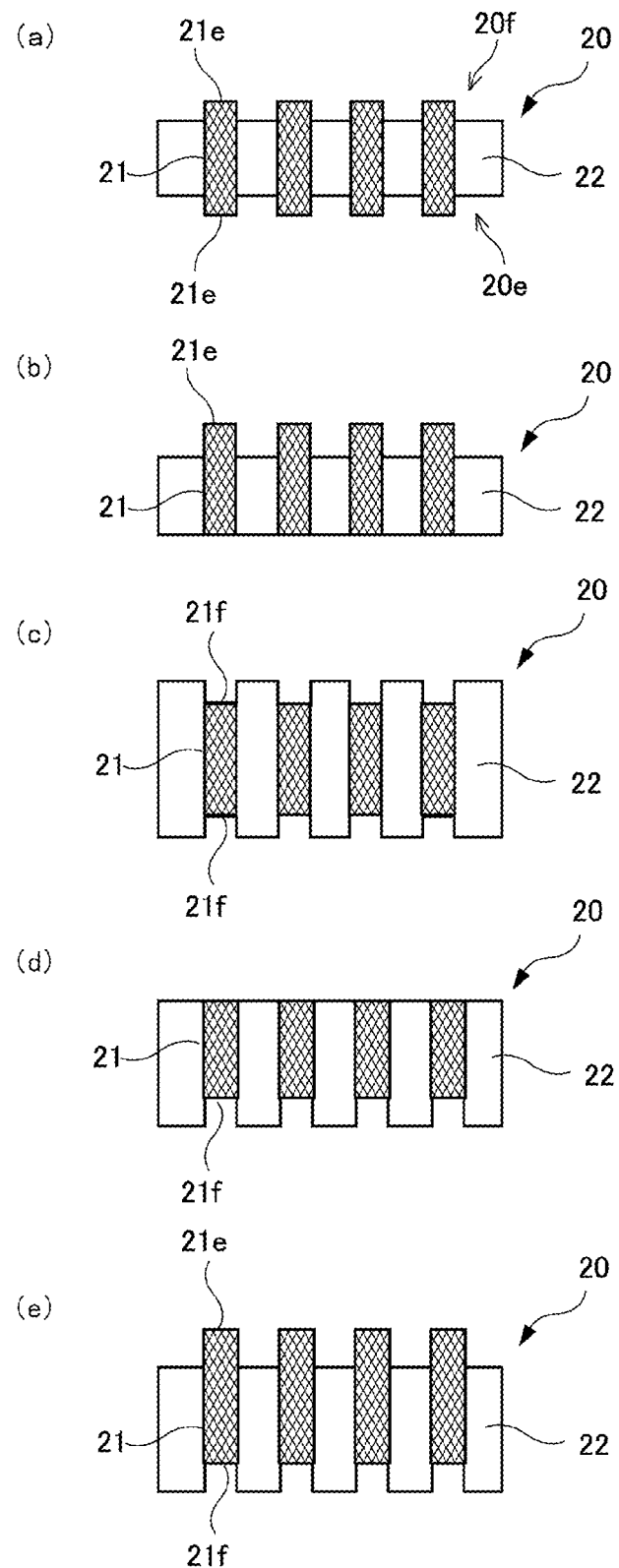
FIG. 9 shows example patterns of recesses/protrusions of the wiring conductors in the wiring structure.

Next, referring to FIG. 9, pattern examples in which protrusions 21e and recesses 21f are formed in the wiring conductors 21 of the wiring structure 20 will be explained. The protrusions 21e indicate places where the wiring conductors 21 protrude from an exposed surface (the bottom-side exposed surface 20e or the top-side exposed surface 20f) of the wiring structure 20. The recesses 21f indicate places where the wiring conductors 21 are recessed relative to an exposed surface of the wiring structure 20.

In the pattern of FIG. 9(a), each of the wiring conductors 21 have protrusions 21e at both the bottom-side exposed surface 20e side and the top-side exposed surface 20f side. In the pattern of FIG. 9(b), the wiring conductors 21 have protrusions 21e at only the top-side exposed surface 20f side. The protrusions 21e may also be provided to only the bottom-side exposed surface 20e side. In the pattern of FIG. 9(c), the wiring conductors 21 have recesses 21f at both the bottom-side exposed surface 20e side and the top-side exposed surface 20f side. In the pattern of FIG. 9(d), the wiring conductors 21 have recesses 21f at only the bottom-side exposed surface 2e side. The recesses 21f may also be provided to only the top-side exposed surface 20f side. In the pattern of FIG. 9(c), the wiring conductors 21 each have a protrusion 21e at the top-side exposed surface 20f side and a recess 21f at the bottom-side exposed surface 20e side. Further, although omitted from the drawing, the presence/absence and position of the protrusions 21e and the recesses 21f can be changed for each of the plurality of the wiring conductors 21. Even in the case that the recess 21f is formed in a wiring conductor 21, this wiring conductor 21 is still considered to be "exposed" from the end surface of the wiring structure 20 as long as the wiring conductor 21 can be accessed from the end surface of the wiring structure 20. Further, even in the case that the recess 21f is formed in a wiring conductor 21, an electrical connection can still be created between this wiring conductor 21 having the recess 21f and the rewiring layer by, for example, forming a protrusion corresponding to the recess 21f on the rewiring layer.

Figure 10:
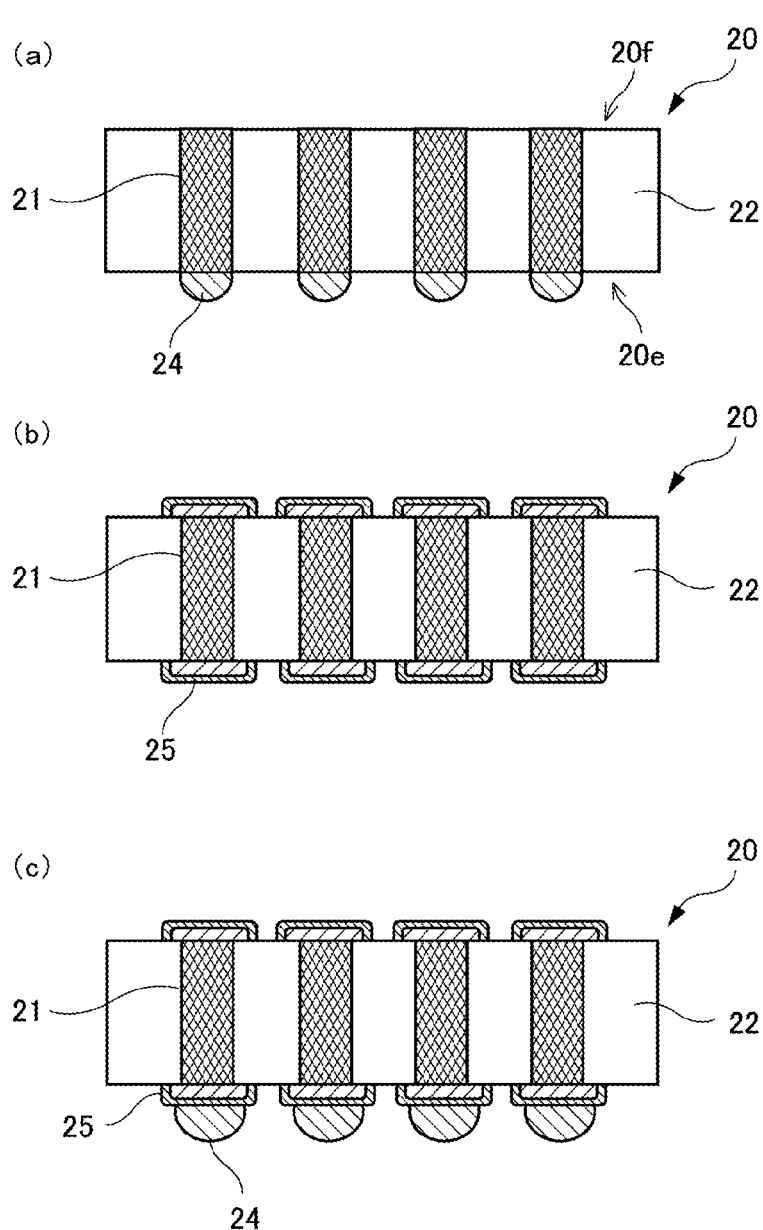
FIG. 10 shows examples of terminal processing of the wiring conductors in the wiring structure.

FIG. 10 shows examples of terminal processing to be performed on the ends of the wiring conductors 21 in the wiring structure 20. In the example shown in FIG. 10(a), solder bumps 24 are attached to the ends on the bottom-side exposed surface 20e side of the wiring conductors 21. In the example shown in FIG. 10(b), plating caps 25, which serve as a protective film, are attached to the ends on the bottom-side exposed surface 20e side and the top-side exposed surface 20f side of the wiring conductors 21. The plating caps 25 may be formed by, for example, electroless plating of Ni/Au or Ni/Pd/Au, etc. In the example shown in FIG. 10(c), the plating caps 25 are attached to both ends of the wiring conductors 21, and the solder bumps 24 are further attached onto the plating caps 25 on the bottom-side exposed surface 20e side. These three patterns of terminal processing shown in FIG. 10 can also be applied to the patterns of the wiring conductors 21 having recesses/protrusions shown in FIG. 9.

Figure 11:
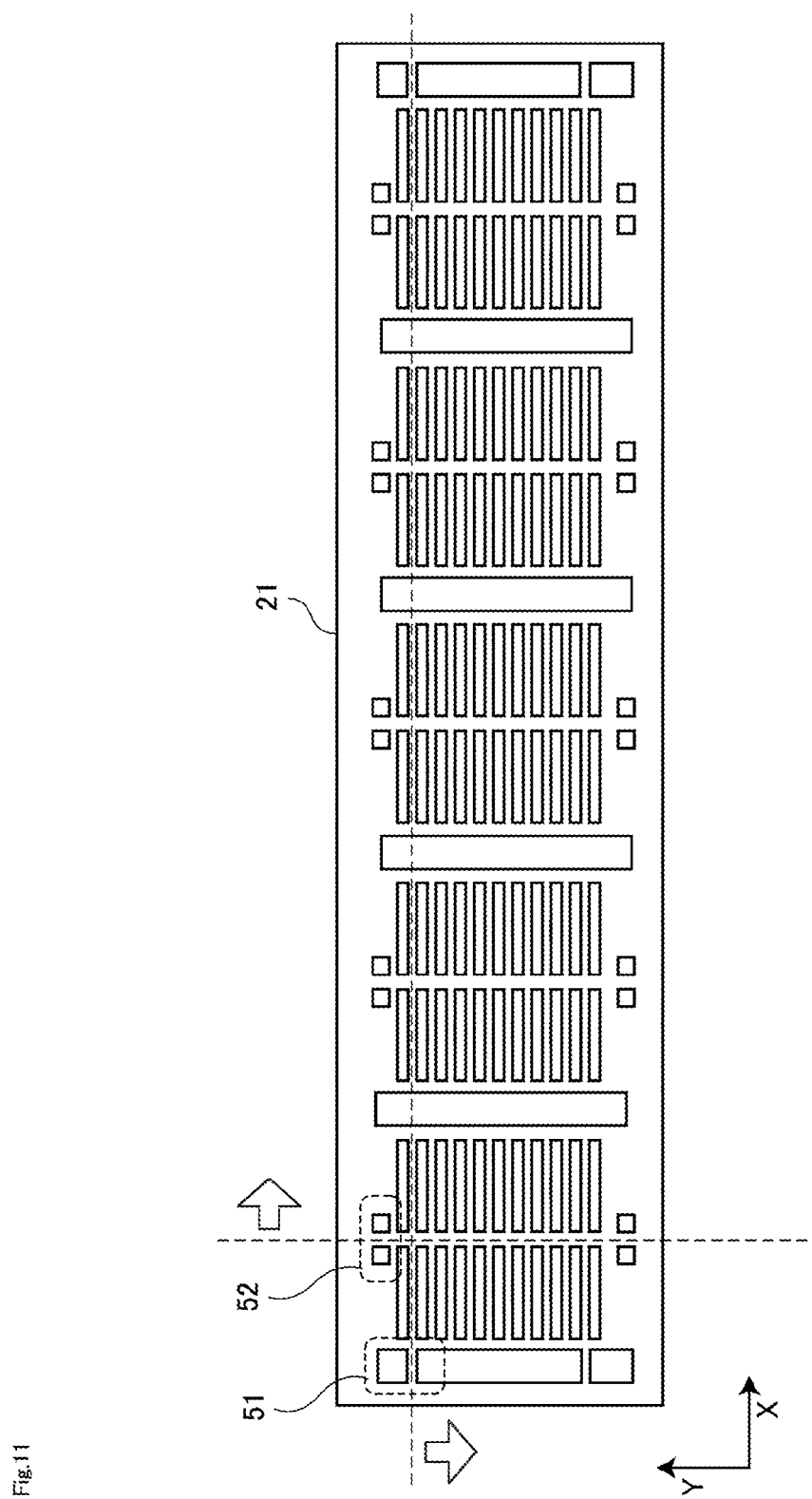
FIG. 11 is a plan view showing an example of a pattern of the wiring conductors.

FIG. 11 shows an example of a pattern of the wiring conductors 21 to be adhered to the layer-shaped insulation part 22 when creating the wiring structure 20. In the example of the creation process shown in FIG. 3, the conductor material was laminated onto the layer-shaped insulation part 22, and then the conductor material was cut by an etching process or the like to form a predetermined pattern of the wiring conductors 21. Instead of this creation process, for example, the wiring structure 20 can also be created as shown in FIG. 11, in which a predetermined pattern of the wiring conductors 21 is prepared in advance, and then the wiring conductors 21 are adhered to the layer-shaped insulation part 22. The predetermined pattern of the wiring conductors 21 may be formed by, for example, punching or laser cutting a metal plate.

If the wiring conductors are laminated over multiple layers, implementing a process of producing the predetermined pattern of wiring conductors in advance as shown in FIG. 11 and then layering the wiring conductors onto the insulation part achieves an effect in that the insulation state of each layer of the wiring conductors becomes easier to maintain compared to, for example, the case in which the wiring conductors are patterned by etching (refer to FIG. 3). In other words, in the case of implementing a process of patterning the wiring conductors by etching and then laminating the wiring conductors as shown in FIG. 3, it is necessary to first fill the uncured mold resin between the layers of wiring conductors and then cure the mold resin to form the insulation part 22. However, the uncured mold resin may flow, resulting in the formation of thin portions in the insulation part, and this may lead to the occurrence of unintended conduction between the layers of wiring conductors. In contrast, if the predetermined pattern of wiring conductors is prepared in advance and then adhered to the layer-shaped insulation part as shown in FIG. 11, then the wiring conductors need only be laminated onto the insulation part which is in a solidified state, and thus when alternately layering the layers of the wiring conductors and the insulation part, the insulation state between the layers of the wiring conductors can be almost certainly maintained. In particular, in the present invention, the layers of wiring conductors included in the wiring structure are used as through conductors that penetrate vertically through the semiconductor device. At this time, the through conductors become part of a circuit for transmitting/receiving electrical signals, and thus the insulation state of each individual through conductor must be secured. However, there is a problem in that if conduction occurs between the through conductors (i.e. between the layers of the wiring conductors), this can cause a short circuit. Therefore, in the present invention, it is particularly necessary for the insulation state of each layer of the wiring conductors to be strictly maintained. Thus, in the technique for creating the wiring structure and then vertically erecting the wiring structure so as to use the layers of wiring conductors in the wiring structure as through conductors, it is particularly effective to implement a process of producing the predetermined pattern of wiring conductors in advance and then layering the wiring conductors onto the insulation part as shown in FIG. 11 so as to reliably maintain the insulation state between the layers of the wiring conductors.

Further, the pattern of the wiring conductors 21 shown in FIG. 11 is provided with alignment marks 51, 52. The alignment marks 51, 52 are used for adjusting the dicing position when dicing and splitting the pseudo wafer 20'. 51 denotes an X direction alignment mark, and 52 denotes a Y direction alignment mark. Each alignment mark 51, 52 consists of, for example, two rectangular holes formed on the wiring conductor 21, wherein a linear gap (conductor material portion) extending parallel to the X direction or the Y direction is present between the two holes. When dicing the pseudo wafer 20', first, the alignment marks 51, 52 are recognized by a dicing device, and then axis alignment of the pseudo wafer 20' and the dicing blade is performed using the alignment marks 51, 52 as a reference. The pseudo wafer 20' is then cut with the dicing blade parallel to the X direction and the Y direction as indicated by the alignment marks to create an individual wiring structure 20. Due to this configuration, the pseudo wafer 20' can be accurately diced.

Figure 12:
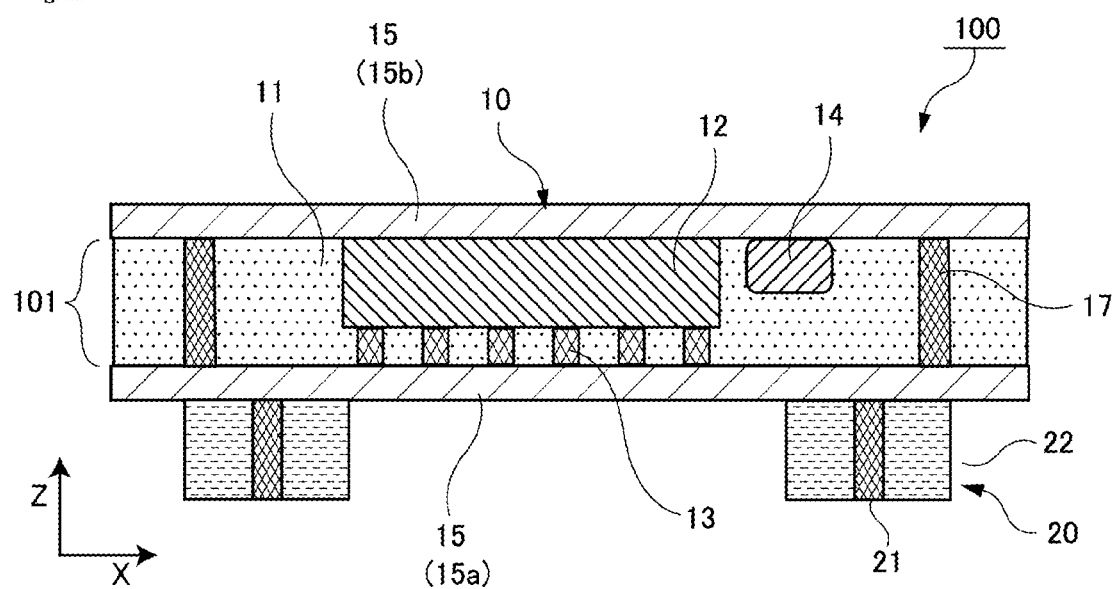
FIG. 12 shows an example of a cross-section structure of the semiconductor device according to the present invention in the case that the wiring structure is to be used as an interposer.

Next, referring to FIG. 12, an embodiment shall be explained in which the wiring structure 20 is used as an interposer (relay part) for connecting the semiconductor device 100 to a package substrate, etc. (not illustrated). As shown in FIG. 12, the semiconductor device 100 has a general structure in which the insulation layer 11 is provided between the rewiring layers 15a, 15b on the bottom surface side and the top surface side, and the semiconductor chip 12 and the electronic element 23, etc. are embedded in the insulation layer 11. Further, in the embodiment shown in FIG. 12, a via 17 that penetrates through the insulation layer 11 is formed by a conventional method such as drilling or laser machining In the semiconductor device 100, the semiconductor chip 12 and the electronic element 23 are electrically connected to either one of the rewiring layers 15a, 15b on the bottom surface side and the top surface side, and the rewiring layers 15a, 15b are electrically connected to each other by the via 17. In the present invention, the wiring structure 20 can be attached to this general semiconductor device 100 so as to use the wiring structure 20 as an interposer.

In more detail, as shown in FIG. 12, the wiring structure 20 is attached to, for example, the bottom surface on the rewiring layer 15a on the bottom surface side. As in the embodiments described above, the wiring structure 20 is created by forming the predetermined pattern of wiring conductors 21 along the planar direction on the insulation part 22 (refer to FIGS. 3 and 4). The wiring structure 20 is then connected to the rewiring layer 15a on the bottom surface side in a state in which the wiring conductors 21 are erected vertically relative to the rewiring layer 15a. Due to this configuration, the wiring structure 20 can function as an interposer. In this way, the use of the wiring structure 20 is not limited to the use as a through conductor disposed within the insulation layer 11 as shown in FIG. 1, etc., and the wiring structure 20 can also be used as an interposer disposed on the rewiring layer as shown in FIG. 12.

In the embodiment shown in FIG. 12, the via 17 is formed by drilling or laser machining However, instead of this configuration, the wiring structure 20 may of course also be created separately and then used as a through conductor as in the embodiment shown in FIG. 1, etc.

Figure 13:
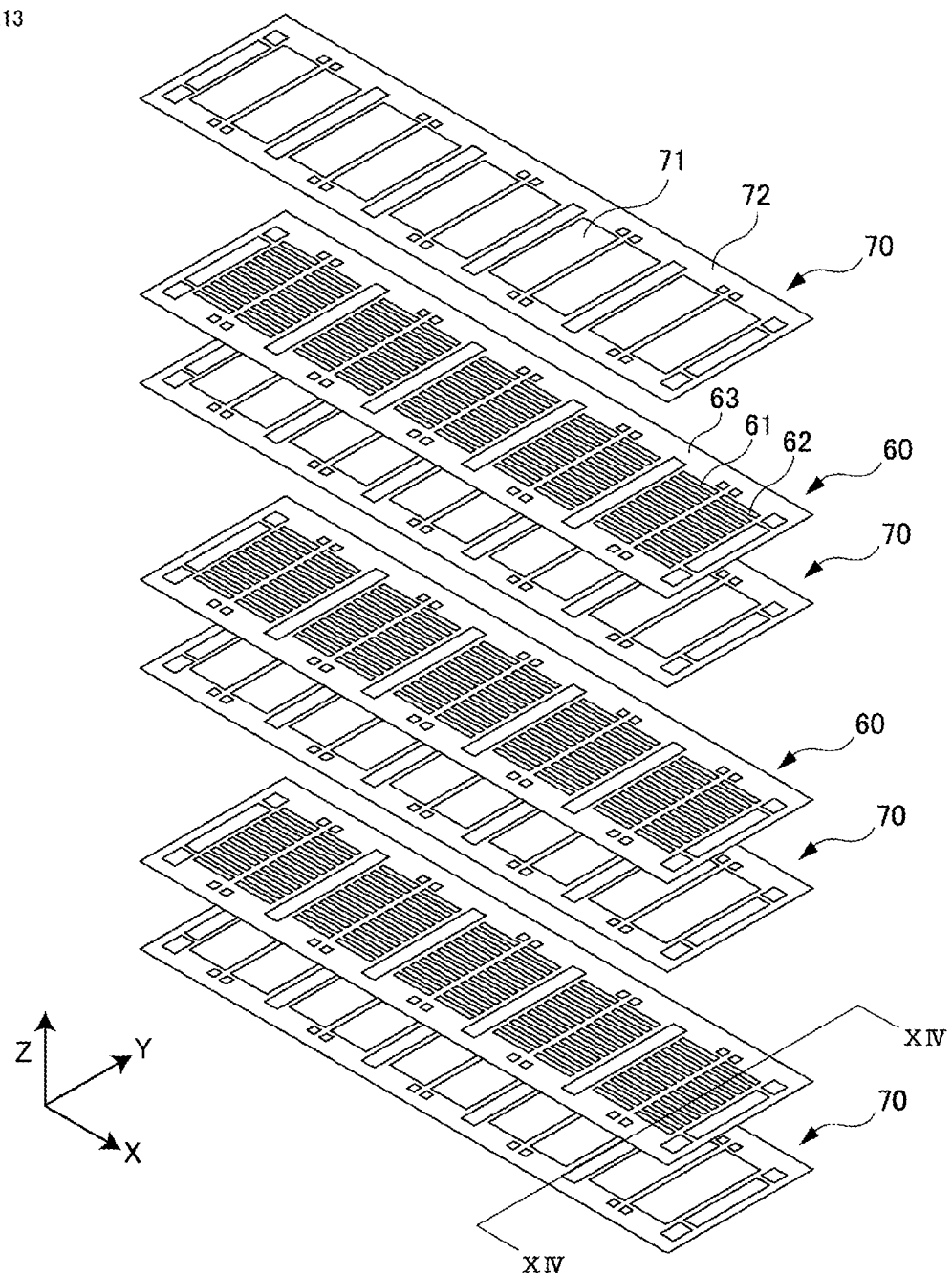
FIG. 13 is a perspective view showing an example of conductor plates and spacer plates.
Figure 14:
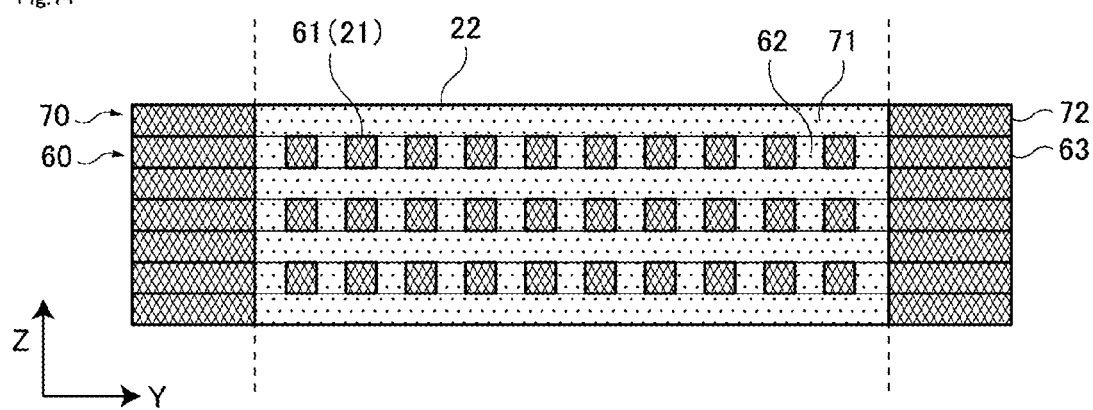
FIG. 14 is a cross-section view showing an embodiment in which the conductor plates and the spacer plates are used to form layers of the wiring conductors and layers of the insulation part.

Next, referring to FIGS. 13 and 14, an embodiment shall be explained in which a layer of the wiring conductors 21 and a layer of the insulation part 22 are formed collectively using a conductor plate 60 and a spacer plate 70. FIG. 13 is a perspective view showing a plurality of the conductor plates 60 and a plurality of the spacer plates 70. FIG. 14 shows a cross-section structure (ZY cross-section) in a state in which the conductor plates 60 and the spacer plates 70 have been alternately laminated and then the insulation material in a fluid state has been flowed in and solidified.

As shown in FIG. 13, first, the conductor plates 60 and the spacer plates 70 are alternately laminated. A spacer plate 70 is positioned at the topmost part and the bottommost part. The conductor plates 60 are plate-shaped members formed from a conductor material such as a metal. Each conductor plate 60 has a peripheral frame part 63 and a plurality of hole parts 62 formed in the interior region surrounded by the frame part 63. In this way, by forming the hole parts 62 so as to penetrate through portions of the interior region of the frame part 63, the remaining parts serve as a predetermined pattern of wiring conductor parts 61. The wiring conductor parts 61 function as the wiring conductors 21 described above. In other words, the pattern of wiring conductors 21 can be flexibly designed by forming the hole parts 62 in the conductor plate 60.

On the other hand, the spacer plates 70 are plate-shaped members that are interposed between the conductor plates 60 so as to form spaces between the wiring conductor parts 61 of the conductor plates 60. The spacer plates 70 are also preferably formed from a conductor material such as a metal similar to the conductor plates 60, but the spacer plates 70 are not particularly limited thereto and may be formed from another material. A frame part 72 is also formed in each spacer plate 70 as in the conductor plate 60. The frame part 63 of the conductor plate 60 and the frame part 72 of the spacer plate 70 are about the same size, and the frame parts 63, 72 can be fitted closely to each other and layered in the vertical direction. In the interior region surrounded by the frame part 72 of the spacer plate 70, opening parts 71 into which the insulation material is filled are formed so as to penetrate through portions that overlap with the wiring conductor parts 61 of the conductor plate 60. In other words, the opening parts 71 of the spacer plate 70 are positioned directly above and directly below the wiring conductor parts 61 of the conductor plate 60.

Next, the conductor plates 60 and the spacer plates 70 are alternately layered in the vertical direction as shown in FIG. 14. At this time, the frame parts 63 of the conductor plates 60 and the frame parts 72 of the spacer plates 70 are preferably bonded to each other by a publicly-known bonding means such as an adhesive. However, it is not necessary to bond the conductor plates 60 and the spacer plates 70 to each other as long as they can be accommodated in a frame, etc. so as to prevent lateral deviation of the conductor plates 60 and the spacer plates 70.

Next, the insulation material in a fluid state (i.e. uncured insulation material) is flowed into the opening parts 71 of the spacer plates 70 and the hole parts 62 of the conductor plates 60. As shown in FIG. 14, the opening parts 71 of the spacer plates 70 and the hole parts 62 of the conductor plates 60 are all in communication with each other, and thus, for example, the insulation material can be filled into all of the opening parts 71 and the hole parts 62 by flowing the insulation material in a fluid state from the opening parts 71 of the spacer plate 70 that is positioned at the topmost layer. As the insulation material in a fluid state, a publicly-known thermosetting resin or photosetting resin (ultraviolet curable resin, etc.) can be used. Upon curing the insulation material, the cured insulation material serves as the insulation part 22 described above.

FIG. 14 shows the state in which the conductor plates 60 and the spacer plates 70 have been alternately laminated and the uncured insulation material has been filled into the hole parts 62 and the opening parts 71 and subsequently cured. The frame parts 63 of the conductor plates 60 and the frame parts 72 of the spacer plates 70 are subsequently cut at the positions indicated by the dashed lines in FIG. 14. Thereby, similar to the above-described embodiments, the wiring structure constituted by the predetermined pattern of wiring conductors 21 and the insulation part 22 surrounding the wiring conductors 21 is obtained. In the present invention, the wiring structure is sealed in the insulation layer of the semiconductor device in a state in which the wiring structure is erected vertically. The wiring conductors of the wiring structure function as through conductors in the semiconductor device.

In the above specification of the present application, embodiments of the present invention were explained while referencing the drawings in order to express the content of the present invention. However, the present invention is not limited to the above embodiments, and includes modified or improved embodiments that would be obvious to those skilled in the art based on the matters described in the specification of the present application.

INDUSTRIAL APPLICABILITY

The present invention can be suitably used in the manufacture of semiconductor devices.

REFERENCE SIGNS LIST

| | |
|---|---|
| 10: device body | 11: insulation layer |
| 12: semiconductor chip | 13: electrode pad |
| 14: electronic element | 15: rewiring layer |
| 15a: first rewiring layer | 15b: second rewiring layer |
| 16: solder ball | 17: via |
| 20: wiring structure | 20a: top surface |
| 20b: bottom surface | 20c: end surface |
| 20d: exposed surface | 20e: bottom-side exposed surface |
| 20f: top-side exposed surface | 20g: left end surface |
| 20h: right end surface | 21: wiring conductor (through conductor) |
| 21a: bending point | 21b: branching point |
| 21c: joining wiring conductor | 21d: side wiring conductor |
| 21e: protrusion | 21f: recess |
| 21E: electricity-transmitting wiring conductor | 21H: heat-radiating wiring conductor |
| 22: insulation part | 23: electronic element |
| 24: solder bump | 25: plating cap |
| 31: mask sheet | 32: photoscreen |
| 40: wafer carrier | 41: support substrate |
| 42: adhesive layer | 51: X direction alignment mark |
| 52: Y direction alignment mark | 60: conductor plate |
| 61: wiring conductor part | 62: hole part |
| 63: frame part | 70: spacer plate |
| 71: opening part | 72: frame part |
| 100: semiconductor device | 101: pseudo wafer structure |

The invention claimed is:

1. A method for manufacturing a semiconductor device in which a circuit element and a through conductor connecting, in a thickness direction, a top surface and a bottom surface of an insulation layer are embedded in the insulation layer, the method comprising:
   creating a wiring structure in which a predetermined pattern of wiring conductors is formed along a planar direction on an insulation part; and
   sealing the wiring structure in the insulation layer in a state where the wiring structure is erected vertically,
   wherein the wiring conductors are thereby caused to function as the through conductor,
   wherein the creating of the wiring structure comprises obtaining a multi-layered wiring structure in which the wiring conductors are formed in a plurality of layers,
   wherein the obtaining of the multi-layered wiring structure comprises:
   laminating a first layer of conductor material on a first layer of the insulation part;
   partially removing the first layer of conductor material to form the predetermined pattern of wiring conductors in the first layer of conductor material;
   providing a second layer of the insulation part on the predetermined pattern of the wiring conductors in the first layer of conductor material such that the second layer of the insulation part fills a gap between the wiring conductors in the first layer of conductor material;
   laminating a second layer of conductor material on the second layer of the insulation part; and
   partially removing the second layer of conductor material to form the predetermined pattern of wiring conductors in the second layer of conductor material.

2. The method for manufacturing a semiconductor device according to claim 1, wherein the creating the wiring structure comprises layering the predetermined pattern of wiring conductors on the insulation part.

3. The method for manufacturing a semiconductor device according to claim 1, wherein the pattern of the wiring conductors is a pattern in which a bending point, a curving point, or a branching point exists in at least one or more locations.

4. The method for manufacturing a semiconductor device according to claim 1, wherein the wiring conductors have a protrusion which protrudes from an edge of the insulation part.

5. A method for manufacturing a semiconductor device in which a circuit element is connected to a rewiring layer and a conductor is provided on the rewiring layer, the method comprising:
   creating a wiring structure in which a predetermined pattern of wiring conductors is formed along a planar direction on an insulation part; and
   connecting the wiring structure to the rewiring layer in a state where the wiring structure is erected vertically,
   wherein the wiring conductors are thereby caused to function as the conductor,
   wherein the creating of the wiring structure comprises obtaining a multi-layered wiring structure in which the wiring conductors are formed in a plurality of layers,
   wherein the obtaining of the multi-layered wiring structure comprises:
   laminating a first layer of conductor material on a first layer of the insulation part;
   partially removing the first layer of conductor material to form the predetermined pattern of wiring conductors in the first layer of conductor material;
   providing a second layer of the insulation part on the predetermined pattern of the wiring conductors in the first layer of conductor material such that the second layer of the insulation part fills a gap between the wiring conductors in the first layer of conductor material;
   laminating a second layer of conductor material on the second layer of the insulation part; and
   partially removing the second layer of conductor material to form the predetermined pattern of wiring conductors in the second layer of conductor material.

6. A method for manufacturing a semiconductor device in which a circuit element and a through conductor connecting, in a thickness direction, a top surface and a bottom surface of an insulation layer are embedded in the insulation layer, the method comprising:
   creating a wiring structure in which a predetermined pattern of wiring conductors is formed along a planar direction on an insulation part; and
   sealing the wiring structure in the insulation layer in a state where the wiring structure is erected vertically,
   wherein the creating of the wiring structure comprises preparing a plurality of predetermined patterns of wiring conductors in advance and then layering the wiring conductors so that the insulation layer is interposed between each of the wiring conductors, wherein in the creating of the wiring structure, a first wiring conductor and a second wiring conductor are in a state of being insulated from each other,
   wherein the wiring conductors function as the through conductor,
   wherein the creating of the wiring structure comprises:
   alternately layering a conductor plate and a spacer plate, the conductor plate including a wiring conductor part that functions as the predetermined pattern of wiring conductors, the wiring conductor part being formed by providing a hole part in an interior region surrounded by a frame part of the conductor plate, the spacer plate made of a conductor material and including an opening part for filling an insulation material, the opening part being a through hole that penetrates the spacer plate in a plate layering direction and is enclosed by a frame part of the spacer plate viewed in the plate layering direction, the opening part being provided at a position overlapping the wiring conductor part of the interior region surrounded by the frame part of the conductor plate;

filling an insulation material in a fluid state into the hole part of the conductor plate and the opening part of the spacer plate; and curing the insulation material in a fluid state.

7. The method for manufacturing the semiconductor device according to claim 6, wherein at least one of the conductor plate or the spacer plate include an alignment mark to adjust dicing positions, wherein the creating of the wiring structure further comprises:

after the curing of the insulation material, dicing the wiring structure by aligning a dicing blade using the alignment mark as a reference.

8. The method for manufacturing the semiconductor device according to claim 6, wherein the creating of the wiring structure further comprises:

after the curing of the insulation material, cutting off the frame part of the conductor plate and the frame part of the spacer plate.

9. A method for manufacturing a wiring structure to be used as a through conductor for connecting, in a thickness direction, a top surface and a bottom surface of an insulation layer which constitutes a semiconductor device, the method comprising:

laminating a first layer of conductor material on a first layer of an insulation part;

partially removing the first layer of conductor material to form a predetermined pattern of wiring conductors in the first layer of conductor material;

providing a second layer of the insulation part on the predetermined pattern of the wiring conductors in the first layer of conductor material such that the second layer of the insulation part fills a gap between the wiring conductors in the first layer of conductor material;

laminating a second layer of conductor material on the second layer of the insulation part; and partially removing the second layer of conductor material to form the predetermined pattern of wiring conductors in the second layer of conductor material, wherein the wiring conductors in the first and second layers of conductor material function as the through conductor.

10. A method for manufacturing a wiring structure to be used as a through conductor for connecting, in a thickness direction, a top surface and a bottom surface of an insulation layer which constitutes a semiconductor device, wherein the manufacturing the wiring structure comprises preparing a predetermined pattern of a plurality of wiring conductors in advance and then layering the wiring conductors so that the insulation layer is interposed between each of the wiring conductors, wherein a first wiring conductor and a second wiring conductor are in a state of being insulated from each other, wherein the wiring conductors function as the through conductor, wherein the manufacturing of the wiring structure comprises:

alternately layering a conductor plate and a spacer plate, the conductor plate including a wiring conductor part that functions as the predetermined pattern of wiring conductors, the wiring conductor part being formed by providing a hole part in an interior region surrounded by a frame part of the conductor plate, the spacer plate made of a conductor material and including an opening part for filling an insulation material, the opening part being a through hole that penetrates the spacer plate in a plate layering direction and is enclosed by a frame part of the spacer plate viewed in the plate layering direction, the opening part being provided at a position overlapping the wiring conductor part of the interior region surrounded by the frame part of the conductor plate;

filling an insulation material in a fluid state into the hole part of the conductor plate and the opening part of the spacer plate; and curing the insulation material in a fluid state.

11. The method for manufacturing the wiring structure according to claim 10, wherein at least one of the conductor plate or the spacer plate include alignment mark to adjust dicing positions, wherein the method further comprises:

after the curing of the insulation material, dicing the wiring structure by aligning a dicing blade using the alignment mark as a reference.

12. The method for manufacturing the wiring structure according to claim 10, further comprising after the curing of the insulation material, cutting off the frame part of the conductor plate and the frame part of the spacer plate.

* * * * *